(12) United States Patent
Deacon

(10) Patent No.: US 6,925,098 B2
(45) Date of Patent: Aug. 2, 2005

(54) THERMALLY WAVELENGTH TUNABLE LASERS

(75) Inventor: David A. G. Deacon, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 10/672,848

(22) Filed: Sep. 26, 2003

(65) Prior Publication Data

US 2004/0066806 A1 Apr. 8, 2004

Related U.S. Application Data

(63) Continuation of application No. 10/005,991, filed on Nov. 8, 2001, now Pat. No. 6,690,694.

(51) Int. Cl.[7] ............................................... H01S 3/10
(52) U.S. Cl. .............................. 372/20; 372/43; 372/45; 372/50; 385/37; 385/14
(58) Field of Search ........................ 372/20, 43; 385/14, 385/37

(56) References Cited

U.S. PATENT DOCUMENTS

| | | | |
|---|---|---|---|
| 4,358,851 A | | 11/1982 | Scifres et al. |
| 4,582,390 A | | 4/1986 | Furuya |
| 4,896,325 A | | 1/1990 | Coldren |
| 5,379,318 A | | 1/1995 | Weber |
| 5,488,681 A | | 1/1996 | Deacon et al. |
| 5,497,393 A | | 3/1996 | Lee |
| 5,652,812 A | * | 7/1997 | Gurib et al. ................. 385/14 |
| 5,732,102 A | | 3/1998 | Bouadma |
| 5,748,660 A | | 5/1998 | Delorme et al. |
| 5,857,039 A | | 1/1999 | Bosc et al. |
| 6,236,774 B1 | | 5/2001 | Lackritz et al. |
| 2002/0197013 A1 | * | 12/2002 | Liu et al. ...................... 385/37 |

OTHER PUBLICATIONS

Rigole, P.J., et al., "State–of–the–art: Widely tunable lasers," *SPIE*, vol. 3001, pp. 382–393.
Kunii, T., et al., "Wavelength Tunable Light Source," *OKI Technical Review 152*, vol. 61, May 1995, pp. 89–92.
Woodward, S.L., et al., "A DBR Laser Tunable by Resistive Heating," *IEEE*, vol. 4, No. 12, Dec. 1992, pp. 1330–1332.
Kokubun, Y., et al., "Temperature–Independent Optical Filter At 1.55 $\mu M$ Wavelength Using A Silica–Based Athermal Waveguide," *IMG2 1–3*, pp. 93–95.
Sarlet, G., et al., "Control of Widely Tunable SSG–DBR Lasers for Dense Wavelength Division Multiplexing," *J. of Lightwave Tech.*, vol. 18, o. 8, Aug. 2000, pp. 1128–1129.
Sarlet, G. et al., "Wavelength and Mode Stabilization of Widely Tunable SG–DBR and SSG–DBR Lasers," *IEEE*, vol. 11, No. 11, Nov. 1999, pp. 1351–1353.
Mason, B., et al., "Design of Sampled Grating DBR Lasers with Integrated Semiconductor Optical Amplifiers," *IEEE*, vol. 12, No. 7, Jul. 2000, pp. 762–764.
Kameda, T., et al., "A DBR Laser Employing Passive–Section Heaters, with 10.8 nm Tuning Range and 1.6 MHz Linewidth," *IEEE*, vol. 5, No. 6, Jun. 1993, pp. 608–610.
Ishii, H. et al., "Narrow Spectral Linewidth Under Wavelength Tuning in Thermally Tunable Super–Structure–Grating (SSG) DBR Lasers," *IEEE*, vol. 1, No. 2, Jun. 1995, pp. 401–407.

(Continued)

*Primary Examiner*—Minsun Oh Harvey
*Assistant Examiner*—Dung Nguyen
(74) *Attorney, Agent, or Firm*—Blakely, Sokoloff, Taylor & Zafman LLP

(57) ABSTRACT

Embodiments of wavelength tunable lasers are disclosed. The wavelength tunable lasers include thermo-optic organic material that has an index of refraction that can quickly vary in response to changes in temperature. By controlling the temperature in the thermo-optic organic material through the use of heaters or coolers, the wavelength tunable lasers and the integrated optical components can be quickly and selectively tuned over a broad range of wavelengths with high spectral selectivity.

25 Claims, 19 Drawing Sheets

OTHER PUBLICATIONS

Mason, B., et al., "Tunable Sampled–Grating DBR Lasers with Integrated Wavelength Monitors," *IEEE*, vol. 10, No. 8, Aug. 1998, pp. 1085–1087.

Liu, H.F., et al., "Generation of Wavelength–Tunable Transform–Limited Pulses from a Monolithic Passively Mode–Locked Distributed Bragg Reflector Semiconductor Laser," *IEEE* vol. 7, No. 10, Oct. 1995, pp. 1139–1141.

Jayaraman, V., et al., "Widely Tunable Continuous–Wave InGaAsp/InP Sampled Grating Lasers," *Elec. Ltrs.*, vol. 30, No. 18, Sep. 1, 1994, pp. 1492–1494.

Jayaraman, V., et al., "Extended Tuning Range in Samples Grating DBR Lasers," *IEEE*, vol. 5, No. 5, May 1993, pp. 489–491.

Lee, S.L., et al., Direct Modulation Of Widley Tunable Sampled Grating DBR Lasers, *SPIE*, vol. 2690, pp. 223–230.

Jayaraman, V., et al., "Demonstration of Broadband Tunability in a Semiconductor Laser Using Sampled Gratings," *Appl. Phys. Lett.*, vol. 60, No. 19, May 11, 1992, pp. 2321–2323.

Jayaraman, V., et al., "Wide Tunability and Large Mode–Suppression in a Multi–Section Semiconductor Laser Using Sampled Gratings, " *Integrated Photonics Research*, New Orleans, LA, paper No. WF1, pp. 306–307, Apr. 13–16, 1992, pp. 106–107.

Jayaraman, V., et al., "Continuous–Wave Operation of Sampled Grating Tunable Lasers with 10 mwatt Output Power, >60nm tuning, and Monotonic Tuning Characteristics," *Indium Phosphide Conference*, Santa Barbara, CA, paper No. MC2, pp. 33–36, Mar. 1994, pp. 82–85.

Oberg, M., et al., "Complete Single Mode Wavelength Coverage Over 40nm with a Super Structure Grating DBR Laser," *J. of Lightwave Tech.*, vol. 13, No. 10, Oct. 1995, pp. 1892–1898.

Bouadma, N., et al., "Integration of a Laser Diode with a Polymer–Based Waveguide for Photonic Integrated Circuits," *IEEE*, vol. 6, No. 10, Oct. 1994, pp. 1188–1190.

Diemeer, M.B.J., et al., "Polymeric Optical Waveguide Switch Using the Thermooptic Effect," *IEEE*, vol. 7, No. 3, Mar. 1989, pp. 449–453.

Kaczmarski, P., et al., "Design of an Integrated Electro–Optic Switch in Organic Polymers, " *IEE Proceedings*, vol. 136, Pt.J., No. 3, Jun. 1989, pp. 152–158.

Tada, K., et al., "Temperature Compensated Coupled Cavity Diode Lasers," *Optical & Quantum Elect.*, 16, 1984, pp. 463–469.

Furuya, K., et al., "A Novel Deposit/Spin Waveguide Interconnection (DSWI) for Semiconductor Integrated Optics," *IEEE*, vol. QE–18, No. 10, Oct. 1982, pp. 1783–1789.

Barrett, C., et al., "Photoinscription of Channel Waveguides and Grating Couplers in Azobenzene Polymer Thin Films," *SPIE*, vol. 3006, pp. 441–449.

Oh, M.C., et al., "Polymeric Wavelength Filters with Polymer Gratings," *Appl. Phys. Lett.*, vol. 72, No. 13, Mar. 30, 1998, pp. 1559–1561.

Manolatou, C., et al., "High Density Integrated Optics," *J. of Lightwave Tech.*, vol. 17, No. 9, Sep. 1999, pp. 1682–1692.

Eldada, L., et al., "Integrated Multichannel OADM's Using Polymer Bragg Grating MZI's," *IEEE*, vol. 10, No. 10, Oct. 1998, pp. 1416–1418.

Eldada, L., et al., "Thermally Tunable Polymer Bragg Grating OADM's," *OFC '99 100C*, Technical Digest Conf. Edition, Feb. 25, 1999, pp. 98–100.

Eldada, L., et al., "Thermo–Optically Active Polymeric Photonic Components," *OFC '2000*, Technical Digest Series, Mar. 8, 2000, pp. 124–126.

\* cited by examiner

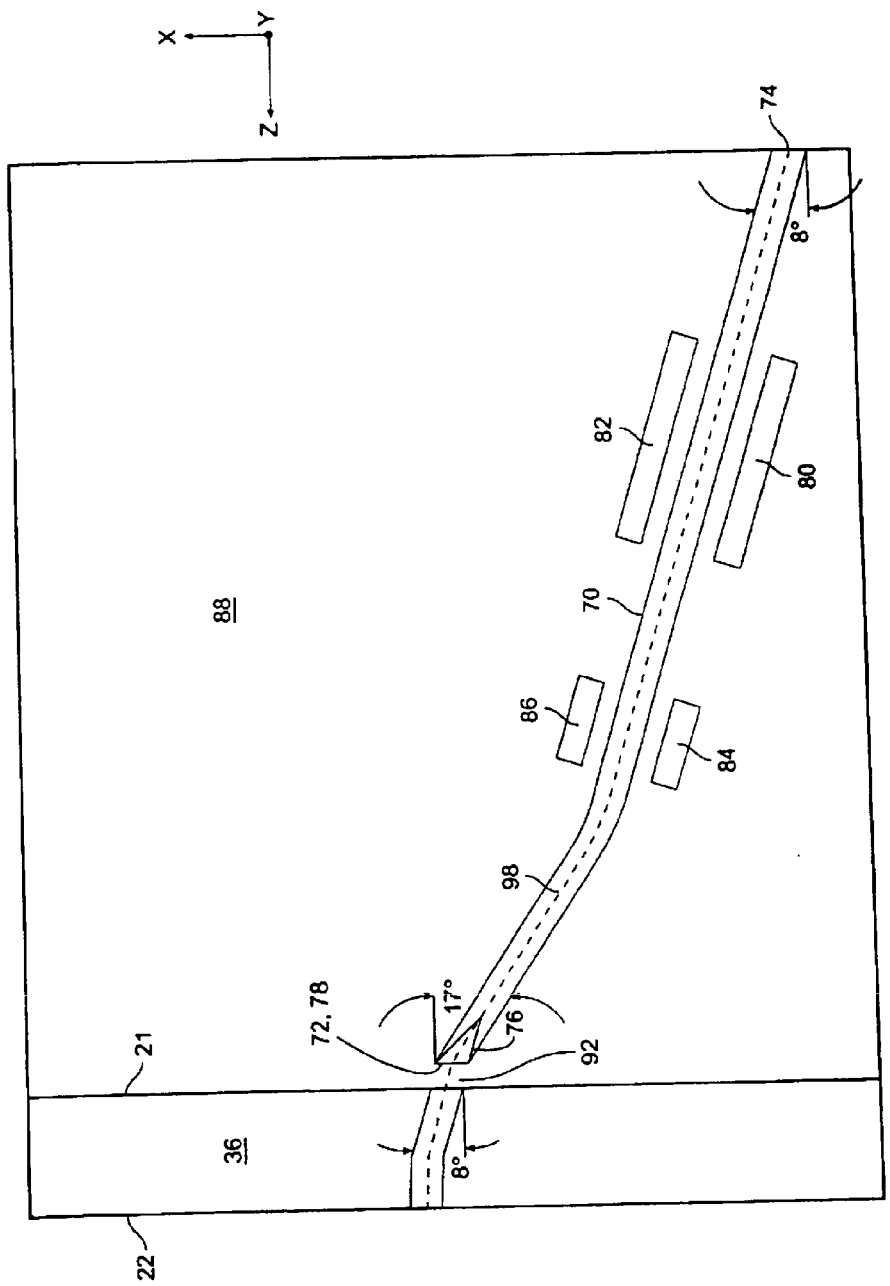

THERMALLY WAVELENGTH TUNABLE LASERS

CROSS REFERENCE TO RELATED APPLICATIONS

The present application is a continuation application of U.S. application Ser. No.: 10/005,991 entitled, "THERMALLY WAVELENGTH TUNABLE LASERS" filed on Nov. 8, 2001 now U.S. Pat. No. 6,690,694.

BACKGROUND OF THE INVENTION

1. Field of the Invention

This invention relates to the field of optical devices that manipulate optical energy of tightly controlled optical wavelength, particularly for use in communication applications. More particularly, the invention relates to lasers which produce optical energy of a specified wavelength and which can be tuned or switched to other specified wavelengths by thermal means.

2. Description of the Related Art

Over the past several years, there has been ever-increased interest in tunable lasers for use in optical communication systems, in general, and for use in dense wavelength division multiplexing (DWDM) applications, in particular. DWDM allows high bandwidth use of existing optical fibers, but requires components that have a broad tunable range and a high spectral selectivity. Such components include tunable lasers that should be able to access a large number of wavelengths within the S-band (1490–1525 nanometers), the C-band (1528–1563 nanometers), and the L-band (1570–1605 nanometers), each different wavelength separated from adjacent wavelengths by a frequency separation of 100 MHz, 50 MHz, or perhaps even 25 MHz.

The distributed Bragg reflector (DBR) laser was the first such tunable laser used in optical communication. The DBR laser consisted of a semiconductor amplifier medium, defining an active section, and an optical waveguide. The optical waveguide included a portion without a grating that defined a phase control section and a portion in which a single grating of typically constant pitch ($\Lambda$) was formed which constituted a distributed Bragg reflector or, more simply, the Bragg section that reflected light at the Bragg wavelength $\lambda_B$. Wavelength tuning of such a DBR laser was performed by transferring heat into the phase control section, the Bragg section, or both. The optical waveguide was defined by an organic layer which constituted a core with another organic confinement layer disposed both above and below the core. Wavelength tuning of such a DBR laser was performed by either injecting current or transferring heat into the phase control section, the Bragg section, or both. Injecting minority carriers made it possible to vary the refractive index of the waveguide and thus control the Bragg wavelength $\lambda_B$ by the equation $\lambda_B = 2n_{eff} \Lambda$ where $\Lambda$ is the pitch of the grating and $n_{eff}$ is the effective refractive index of the waveguide. Alternatively, a pair of heating resistance strips was disposed on opposite outer surfaces of the laser component for the phase control section, the Bragg section, or both. By independently controlling the voltages to the heating resistance strips, the temperature and hence the index of refraction of the organic layers that form the optical waveguide was controlled via the thermo-optical effect. Tuning by injecting current had the disadvantage of increasing optical loss and adding optical noise. Tuning by heating had the disadvantage of increasing optical loss and adding optical noise. Both options induce long-term drift in the Bragg wavelength thereby reducing reliability. For a more detailed discussion of a wavelength tunable DBR laser by heating, please refer to U.S. Pat. No. 5,732,102 by Bouadma entitled "Laser Component Having A Bragg Reflector of Organic Material, And Method of Marking It" which is hereby incorporated by reference.

A super structure grating distributed Bragg reflector (SSG-DBR) laser was another type of tunable laser that held great promise. The InGaAsP-InP SSG-DBR laser was comprised of a semiconductor amplifier medium with an InGaAsP/InGaAsP multiple quantum wells active region, an SSG-DBR section on both sides of the semiconductor amplifier medium, and a phase control section between one of the SSG-DBR sections and the semiconductor amplifier medium. Thin film Pt heaters were formed on the top surface and corresponding electrodes were formed on the bottom surface of each SSG-DBR section and the phase control section. The two SSG-DBR sections were used as mirrors with different sampling periods giving different peak separations and different reflective combs in the reflectivity-wavelength spectrum. In the reflectivity-wavelength spectrum, only one reflective peak associated with each SSG-DBR section coincided and where these reflective peaks coincided at a cavity mode, that cavity mode was selected for lasing. Wavelength tuning of the SSG-DBR laser was performed by injection current into or heating of either SSG-DBR section or the phase control section. Current injection into or heating of the SSG-DBR sections changed the refractive index of each waveguide and shifted the reflection spectrum of each SSG-DBR section. Similarly, current injection into or heating the phase control section shifted the cavity modes. While providing a broad tuning range, wavelength tuning by injection current caused considerable spectrum line width broadening and a decrease in emitted power, both important criteria in DWDM applications. Further, the long term affects of wavelength tuning by injection currents on SSG-DBR laser performance remains unknown. In addition, current SSG-DBR lasers are monolithic devices fabricated from InGaAsP/InP and the manufacture of such SSG-DBR lasers results in low yield because of the immaturity of the InP or GaAs based processing technology. For a more detailed discussion of a wavelength tunable SSG-DBR laser by injection current, please refer to a paper by Ishii et al. entitled "Narrow Spectral Linewidth Under Wavelength Tuning in Thermally Tunable Super-Structure-Grating (SSG) DBR Lasers," IEEE Journal of Selected Topics in Quantum Electronics, Vol. 1, No. 2, Pages 401–407, June 1995, which is hereby incorporated by reference.

For a more detailed discussion of the state of the art on widely tunable lasers, please refer to a paper by Rigole et al. entitled "State-of-the-art: Widely Tunable Lasers," SPIE, Vol. 3001, Pages 382–393, 1997, which is hereby incorporated by reference.

SUMMARY OF THE INVENTION

Embodiments of novel tunable lasers are disclosed which can quickly and repeatedly access a broad range of relevant wavelengths with high spectral selectivity yet without the problems associated with the prior art.

A first embodiment of the novel tunable laser includes a substrate fabricated of a first material that supports a gain means, a first waveguide, and a second waveguide. The gain means is fabricated of a second material and includes an active emission layer that generates optical energy. The active emission layer includes a first and a second facet. The first waveguide includes a first core and a first end on the first core, which may include a first taper, is adjacent to the first facet to receive the optical energy. The first core is fabricated from an inorganic material and the first waveguide is fabricated from both inorganic and thermo-optical organic material. A first reflector receives the optical energy propagating along the first waveguide and reflects the optical energy if the optical energy has a wavelength that is one of a plurality of first reflection wavelengths. The second waveguide includes a second core and a first end on the second core, which may include a taper, is adjacent to the second facet and receives optical energy. The second core is fabricated from an inorganic material and the second waveguide is fabricated from both inorganic and thermo-optical organic material. A second reflector receives the optical energy propagating along the second waveguide and reflects the optical energy if the optical energy has a wavelength that is one of a plurality of second wavelengths. Between the first end of the first reflector and the first reflector along a reflector free-portion of the first waveguide, there may be a phase control section which can slightly shift the Fabry-Perot resonant cavity modes associated with the tunable laser. Thermo-optical organic material is disposed to shift the plurality of first reflection wavelengths, the plurality of second reflection wavelengths, and the Fabry-Perot resonant cavity modes in response to changes in the temperature in the thermo-optical organic material. Tuning of the laser may be achieved by changing the temperature in the thermo-optical organic material which has an index of refraction that varies in response to changes in temperature. By varying the temperature of heaters or coolers in the thermo-optical organic material associated with the first reflector, the second reflector, the phase control portion, or combinations thereof, a broad wavelength tuning range with high spectral selectivity is possible.

A second embodiment of the novel tunable laser includes a substrate fabricated of a first material that supports a gain means and a waveguide. The gain means is fabricated of a second material and includes an active emission section, which generates optical energy, and includes a facet. The waveguide includes a core and an end on the core, which may include a taper, is adjacent to the facet to receive optical energy. The core is fabricated from an inorganic material and the waveguide is fabricated from both inorganic and thermo-optical organic material. A first reflector receives the optical energy propagating along the waveguide and reflects the optical energy if the optical energy has a wavelength that is one of a plurality of first reflection wavelengths. A second reflector receives the optical energy propagating along the waveguide and reflects the optical energy if the optical energy has a wavelength that is one of a plurality of second wavelengths. Between the end and the first reflector and between the first and second reflectors, both along a reflector free-portion of the waveguide, there may be phase control sections which can slightly shift the Fabry-Perot resonant cavity modes associated with the tunable laser and an etalon formed by the first and the second reflectors. Thermo-optical organic material is disposed to shift the plurality of first reflection wavelengths, the plurality of second reflection wavelengths, and the Fabry-Perot resonant cavity modes in response to changes in the temperature of the thermo-optical organic material. Tuning of the laser may be achieved by changing the temperature in the thermo-optical organic material which has an index of refraction that varies in response to changes in temperature. By varying the temperature of heaters or coolers in the thermo-optical organic material associated with the first reflector, the second reflector, the phase control portions, or combinations thereof, a broad wavelength tuning range with high spectral selectivity is possible.

A third embodiment of the novel tunable laser includes a substrate that supports a gain means and a waveguide. The gain means includes an active emission layer, which generates optical energy, and includes a facet. The waveguide includes a core and an end on the core, which may include a taper, is adjacent to the facet and receives the optical energy. The core is fabricated from inorganic material and the waveguide is fabricated from both inorganic and thermo-optical organic material. A reflector receives the optical energy propagating along the waveguide and reflects the optical energy if the optical energy has a wavelength that is one of a plurality of first reflection wavelengths. Thermo-optical organic material is disposed to shift the plurality of reflection wavelengths in response to changes in the temperature in the thermo-optical organic material. Tuning of the laser may be achieved by changing the temperature in the thermo-optical organic material which has an index of refraction that varies in response to changes in temperature. By varying the temperature of heaters or coolers in the thermo-optical organic material, a broad wavelength tuning range with high spectral selectivity is possible.

The thermo-optical organic material of the tunable laser is preferably selected so as to have a high coefficient of variation in refractive index as a function of temperature, the magnitude of which should be preferably greater than $1 \times 10^{-4}/°C$. Examples of thermo-optical organic material used in the tunable laser and that exhibit these characteristics include polymers derived from methacrylate, siloxane, carbonate, styrene, cyclic olefin, or norbornene.

An integrated optical component is also disclosed for the second embodiment of the tunable laser above. The integrated optical component includes all the functional elements associated with the respective embodiment of the tunable laser, but does not include the gain means that is typically fabricated from a different material than the integrated optical component.

It should be observed that, except for the gain means, the tunable laser is fabricated using Si processing technology and only the gain means is of GaAs, InP, InGaAsP, or other exotic semiconductor materials which requires complex and sensitive processing technology, such as epitaxial growth and cleaving. The gain means is independently fabricated with a minimum of structure. Accordingly, the tunable laser is easy to manufacture, cost effective to manufacture, and results in high yield.

BRIEF DESCRIPTION OF THE DRAWINGS

Other objects and advantages of the invention will become apparent upon reading the following detailed description and upon reference to the accompanying drawings in which:

FIG. 1D is a diagrammatic representation of a top view along the line 1D—1D in FIG. 1A which follows the optical path of the thermally wavelength tunable laser;

Figure 1A:
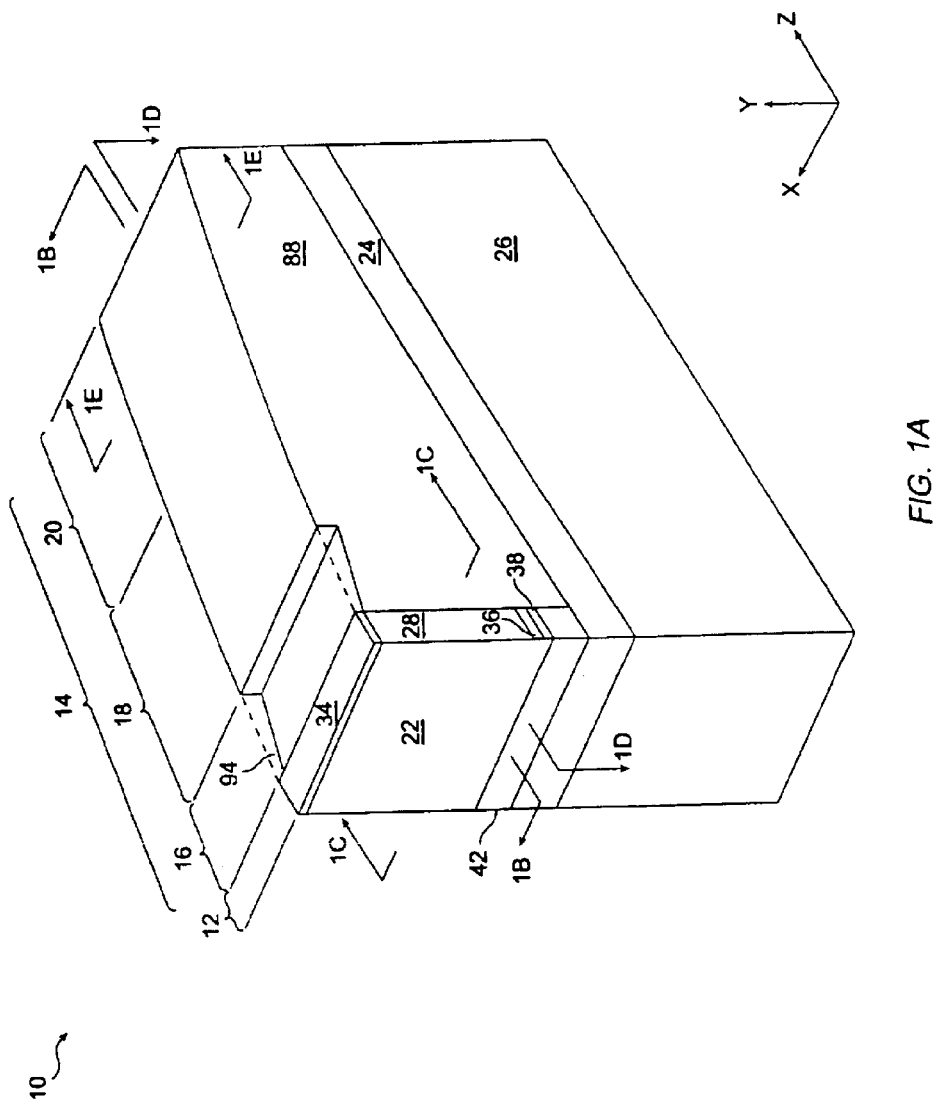
FIG. 1A is a right side elevational view of a first embodiment of a thermally wavelength tunable laser accordance with the principals of this invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to FIG. 1A, there is illustrated a first embodiment of a laser 10 that is highly wavelength tunable and has high spectral selectivity. The tunable laser 10 includes a gain means 12 which provides optical energy and a passive section 14 which processes the optical energy received from the gain means 12. The passive section 14 includes a taper section 16 which couples the optical energy to a first waveguide, a phase control section 18 which slightly shifts the Fabry-Perot resonant cavity modes associated with the tunable laser 10, and a reflector section 20 which may reflect optical energy dependent upon the wavelength of the optical energy.

Most generally, the gain means 12 provides sufficient optical energy to overcome the losses associated with the components that make up the tunable laser 10 and to create oscillation within the tunable laser 10. The gain means 18 includes a first facet 21 (FIG. 1D) and a second facet 22. The second facet 22, most preferably, has a highly reflective (HR) coating thereon, but may also have a partially reflective and partially transmissive coating thereon, depending on whether optical energy will be outputted from this facet.

Figure 1B:
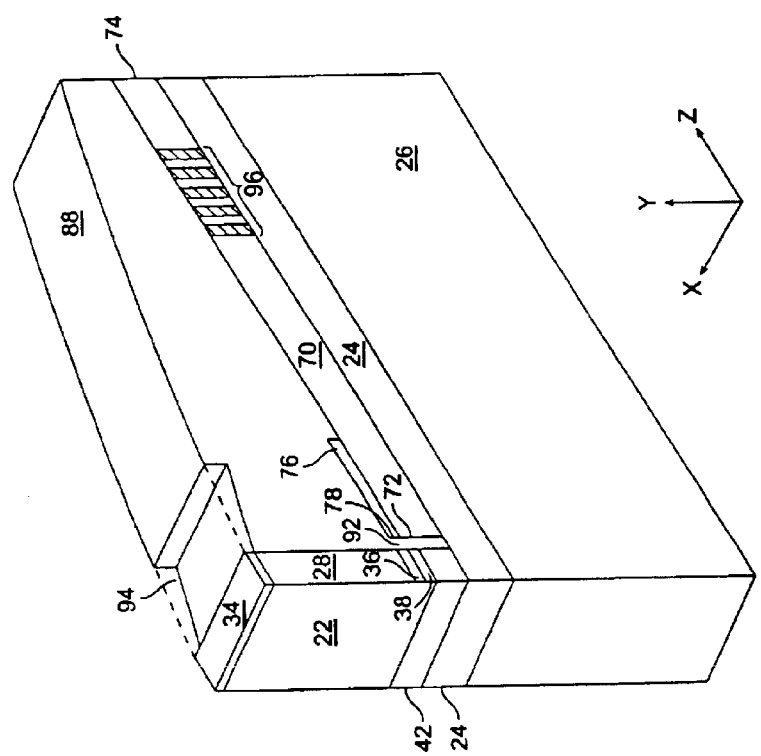
FIG. 1B is a right side elevational view along line 1B—1B in FIG. 1A.
Figure 1C:
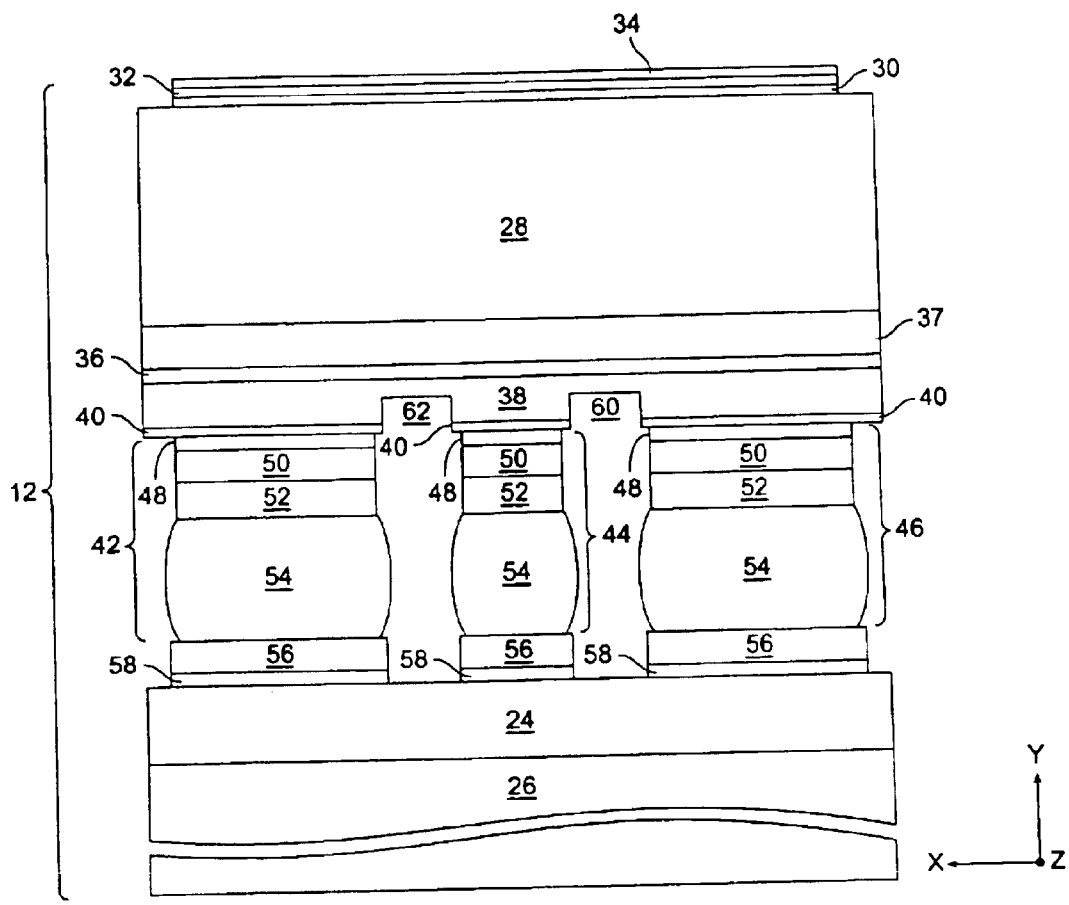
FIG. 1C is a detailed front view of the laser diode along the line 1C—1C shown in FIG. 1A.

Referring now to FIG. 1C, the gain means 12 has been flipped over and flip chip bonded to a cladding layer 24 which is disposed on a substrate 26 of the tunable laser 10. The gain means 12 is a solid-state laser which is preferably a semiconductor diode laser. The gain means 12 may be a ridge laser or a buried hetro-structure with or without multiple quantum wells. As shown, the gain means 12 is a ridge laser that is preferably fabricated on InP so as to emit in the 1550 nm region or the 1310 nm region. Alternatively, the gain means 12 may be fabricated on other convenient substrates such as sapphire or gallium arsenide. The gain means 12 includes a substrate 28 of n-type InP and sequentially deposited on a major surface of the substrate 28 is an adhesion layer 30 typically formed of titanium, a diffusion barrier layer 32 typically formed of platinum, and a bonding layer 34 typically formed of gold. A first clad layer 37 is formed on the other major surface of the substrate 28. An active emission layer 36 of a semiconductor material, such as InGaAsP or InGaAlP that preferably includes strained quantum wells, is formed on a major surface of the first clad layer 37 and provides the optical energy of the tunable laser 10. The dimensions of the active emission layer 36 are variable, but may typically be a fraction of a micron in the y direction (thickness) and at least a couple of microns in the x direction (width). The optical energy produced by the active emission layer 36 is typically a single transverse mode with a mode size at full width half maximum (FWHM) of approximately 0.6 microns in the y direction (height) and approximately 3 microns in the x direction (width). A second clad layer 38 is disposed on the other major surface of the active layer 36. Both clad layers 37 and 38 are formed of a lower refractive index semiconductor material than the active emission layer 36. On the surface of clad layer 38, a contact layer 40 which provides low electrical resistance is grown. All of these layers may be structured into sublayers as is known in the art.

A plurality of solder balls 42, 44, and 46 connect the gain means 12 to the cladding layer 24. Each solder ball includes a first adhesion layer 48 typically formed of titanium, a diffusion barrier layer 50 typically formed of platinum, a bonding layer 52 typically formed of gold, a solder ball 54 typically formed of 80% gold and 20% tin, a bonding layer 56 typically formed of gold, and a second adhesion layer 58 typically formed of chromium. Many alternative solder, barrier, adhesion, and dewetting materials may also be used, to enable processing at different temperatures, as may be alternative metal layers. An external electrical contact (not shown) exists on the bonding layer 34 and the bonding layer 56 of the central solder ball 44 thereby enabling the active emission layer 36 to be fed with amplification current in the region of the optical mode. Trenches 60 and 62 are etched through the contact layer 40 and through most of the cap layer 38 on both sides of the central solder ball 44 which effectively bounds most of the generated optical energy to the active emission layer 36 between the trenches 60 and 62.

During operation, the gain means 12 generates several hundred milli-watts of thermal power, the majority of which is generated in the active emission layer 36 between the trenches 60 and 62, and this thermal power is dissipated through an efficient thermal flow through and beneath the gain means 12. Thermal power generated in the active emission layer 36 is dissipated through the plurality of solder balls 42, 44, and 46, through the cladding layer 24 that is typically formed of silica, and into the substrate 26 that is typically formed of silicon, but may be also formed of sapphire, gallium arsenide, indium phosphide, metal, glass, or ceramic. The substrate 26 is substantially thicker than the cladding layer 24 and acts as a heat reservoir for the tunable laser by maintaining a relatively constant temperature with a low thermal gradient. Preferably, the rise above ambient temperature in the gain means 12 is kept beneath 50° C. and, more preferably, beneath 10° C. A single or a plurality of heat sinks (not shown) may be disposed beneath the substrate 26 in order to aid in dissipating thermal power from, most importantly, the gain means 12, but also from the passive section 14, as the cladding layer 24 and the substrate 26 are common to the gain means and the passive section 14. A thermal sensor (not shown) may also be disposed near the gain means 12 to control the heat sinks (not shown) and to thereby regulate the temperature in the gain means 12, the cladding layer 24, and the substrate 26.

Figure 1E:
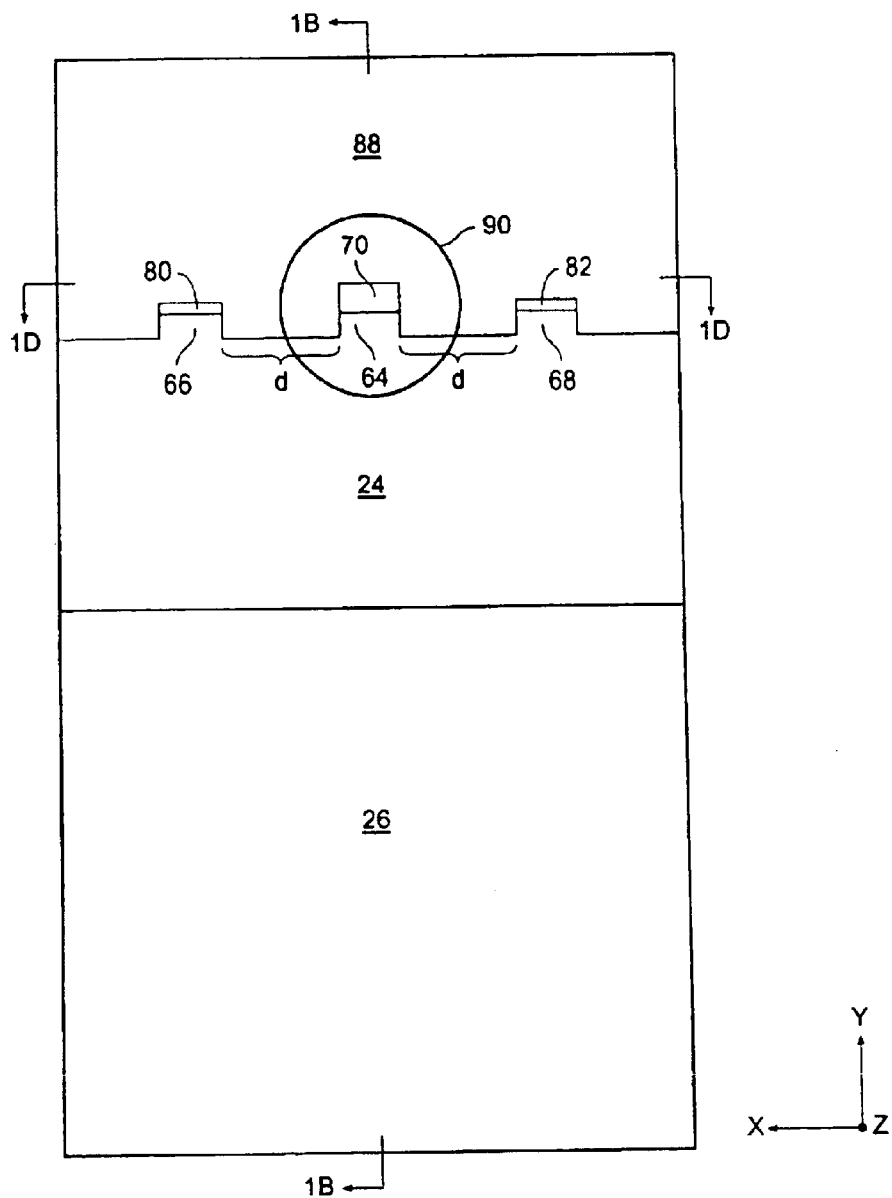
FIG. 1E is a front view of a first embodiment of the heaters and the waveguide along the line 1E—1E in FIG. 1A.

Referring now to FIG. 1E, a first embodiment of the heaters and the waveguide associated with the reflector section 20 are shown. Specifically, the cladding layer 24 is etched to produce pedestal regions 64, 66, and 68 which have a height of approximately 1.5 $\mu$m. The pedestal region 64 has a width of approximately 3 $\mu$m and the pedestal regions 66 and 68 have a width of approximately 7 $\mu$m. A germanosilicate (GeSiO$_2$) layer is deposited on the cladding layer 24 and etched which defines a first core 70 on the pedestal region 64, the first core 70 forming part of a waveguide described below. As best shown in FIG. 1B, the first core 70 includes a first end 72 which has an anti reflection (AR) coating thereon to prevent back reflection into the first core 70 and a second end 74 which may have either an AR coating or a partially reflective and partially transmissive coating, depending on whether optical energy exits the tunable laser 10 via the second end 74. The first core 70 is between 1 to 3 $\mu$m thick, between 2 to 20 mm long, and can also be doped silica with germanium, nitrogen, lead, tin, phosphorous, boron, or combinations thereof. As best shown in FIG. 1B, a first taper 76 is formed on the top surface of the first core 70 and a first surface 78 of the first taper 76 is aligned with that portion of the active emission layer 36 that is between the trenches 60 and 62 so as to couple as much of the optical energy produced by the active emission layer 36 as possible into the first core 70. Alternatively, the taper 76 can be directly incorporated into the gain means 12, rather than into the first core 70. In this situation, the first end 72 is no longer AR coated and is also aligned with that portion of the active emission layer 36 that is between the trenches 60 and 62. Alternatively, the gain means 12 and the first waveguide 90, defined below, can be designed so that the size of the optical mode propagating from the active emission layer 36, into and then along the first core 70 remains constant and with minimal optical loss. In this situation, a taper would not be necessary, the first end 72 would no longer be AR coated, and the first end 72 would be aligned with that portion of the active layer 36 that is between the trenches 60 and 62.

Figure 1F:
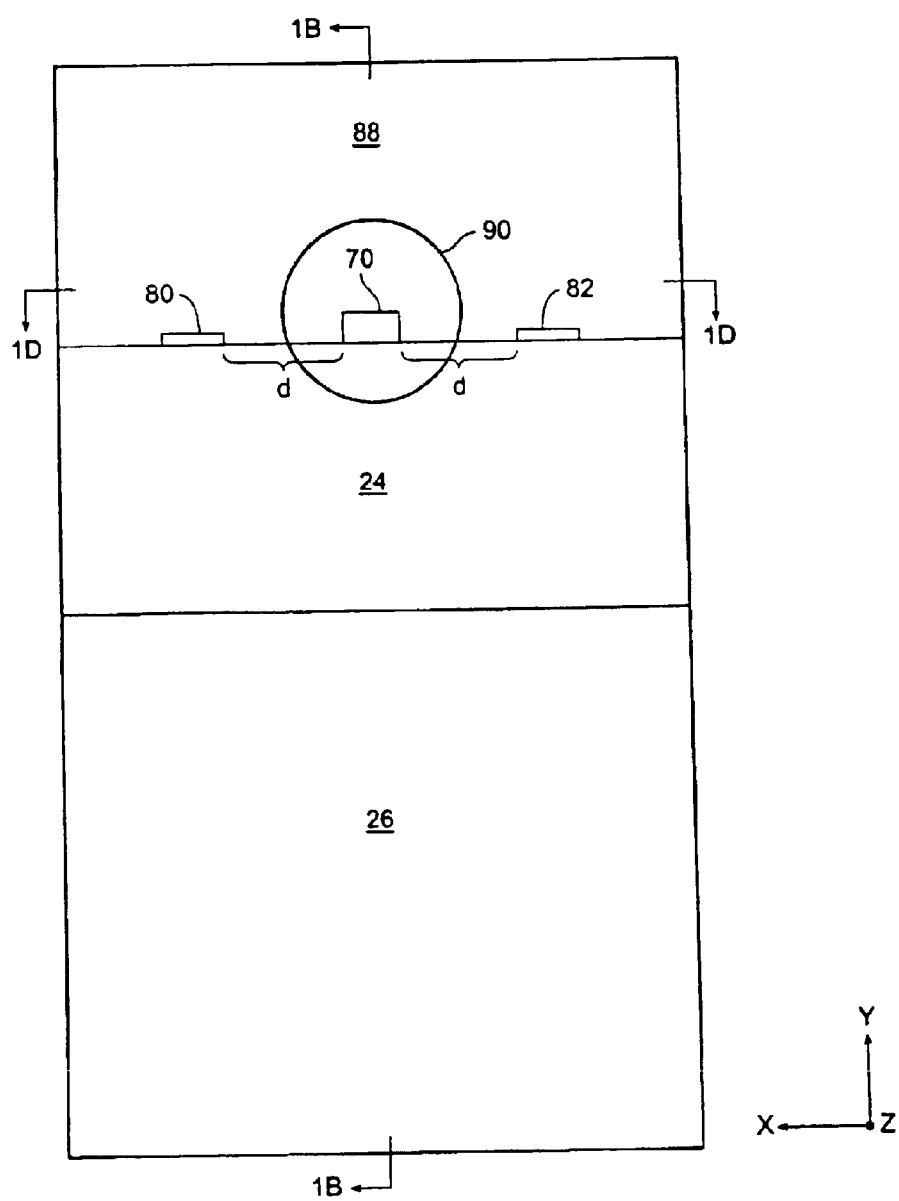
FIG. 1F is a front view of a second embodiment of the heaters and the waveguide along the line 1E—1E in FIG. 1A.

Referring again to FIG. 1E, heaters 80 and 82 are disposed upon pedestal regions 66 and 68. The heaters 80 and 82 are chromium (Cr) in this embodiment, but may be of any conductive material including NiCr, Ti and W. The heaters 80 and 82 are approximately 7 $\mu$m wide, between 0.05 to 0.1 $\mu$m thick, and approximately 1 mm in length. These heater dimensions are chosen to produce the desired heat output per unit length, and may be adjusted as is well known in the art to change the material, the heat production, and the longevity of the heaters. Electrical contacts and wires (both not shown) are provided to apply a potential to or for passing current through each heater. The total distance from the heaters 80 and 82 to the first core 70 is the distance (d). The distance (d) is chosen so that (a) the optical mode experiences minimal absorption loss caused by the material of the heaters and (b) the temperature of the thermo-optical organic material, discussed below, disposed adjacent to the first core can be quickly and efficiently changed. In FIGS. 1E and 1F, the distance (d) is at least 12 $\mu$m. The heaters shown in FIG. 1 are resistive heaters, but this invention contemplates the use of thermoelectric heaters or coolers that employ the Peltier effect. Specifically, thermoelectric heaters or coolers that employ the Peltier effect may be disposed on the pedestal region 66 and 68, the cladding layer 24, or the substrate 26. Stated as simply as possible, thermoelectric heaters and coolers that employ the Peltier effect are semiconductor materials with dissimilar characteristics that are connected electrically in series and thermally in parallel so that two junctions are created, namely, a hot and a cold junction. If operating as a thermoelectric cooler, the cold junction should be located near the core while the hot junction should be as close to the heat sinks (not shown) as possible. Similarly, if operating as a thermoelectric heater, the hot junction should be located near the waveguides while the cold junction should be as close to the heat sinks (not shown) as possible.

The phase control section 18 (FIG. 1A) has the same heater and waveguide structure (not shown) as that shown in FIG. 1E. A pair of heaters 84 and 86 associated with the phase control section are shown in FIG. 1D. Referring again to FIG. 1D, a thermo-optical organic material 88 is applied preferably by spinning onto and over the heaters 80, 82, 84, and 86, the first core 70, and onto the cladding layer 24. The thermo-optical organic material 88 has a high coefficient of variation in its' refractive index as a function of temperature, the magnitude of which is preferably greater than $1 \times 10^{-4}/°$ C. The index of refraction of the thermo-optical organic material 88 is preferably close to or equal to the index of the cladding layer 24 at the normal operating temperature of the tunable laser 10, namely, the temperature from which the heaters must start heating the thermo-optical organic material 88. Specific materials may be selected for the thermo-optical organic material including, but not limited to, methacrylates, siloxanes, carbonates, styrenes, cyclic olefins, and norbornenes. It is useful to adjust the index of refraction of these materials by fluorination (replacing hydrogen molecules with fluorine molecules in the molecular formula of some of the polymer repeat units) as this has the added benefit of reducing the optical loss in the infrared region. Many of these materials meet the optical specifications for the thermo-optical organic material 88. A specific material may be chosen according to an optimization process of the secondary characteristics such as minimizing birefringence, residual stress, and chemical reactivity, while maximizing wetting, adhesion, working lifetime, and thermal resistance. The thickness of the thermo-optical organic material 88 is chosen such the thermo-optical organic material-air interface adds only minimal and preferably no optical loss to the optical performance of the tunable laser 10.

Referring now to FIG. 1E, a first waveguide 90 includes the first core 70, portions of the thermo-optical organic material 88 adjacent to the first core 70, and portions of the cladding layer 24 beneath the first core 70, as shown in FIG. 1E and 1F. The diameter of the first waveguide 90 encompasses essentially all the optical mode. The mode size and shape is dependant upon the temperature of the thermo-optical organic material 88 adjacent to the first core 70. At room temperature and with the heaters off, the index of refraction of the thermo-optical organic material 88 is at its highest, but is lower than the index of the first core 70. The optical mode under these conditions will be in the first core 70 and will be partially in both the thermo-optical organic material 88 and the cladding layer 24. With the heaters 80 and 82 (FIG. 1E) on, the temperature of the thermo-optical organic material 88 adjacent to the first core 70 increases and the index of refraction of the thermo-optical organic material 88 adjacent to the first core 70 decreases. Under these conditions, the optical mode will have appeared to have "sunk" towards the cladding layer 24 when compared to the location of the optical mode at room temperature. As portions of the thermo-optical organic material 88 adjacent to the first core 70 and along the z-axis (FIG. 1E) are heated while other portions remain at room temperature, the size and shape of the optical mode along the z direction of the first core 70 changes, but the change is preferably gradual, adiabatic, and therefore with minimal optical loss.

FIG. 1F shows a second embodiment of the heaters and the waveguide associated with the reflector and the phase control sections. The second embodiment differs from the first embodiment in that the second embodiment does not include the pedestal regions 64, 66, and 68 which are found in the first embodiment. The removal of the pedestal regions makes the fabrication process for the tunable laser of the second embodiment simpler but also reduces the effective tuning range when compared to that of the first embodiment.

Referring now to FIG. 1B, the gain means 12 (FIG. 1A) is flip chip bonded to the cladding layer 24 so as to couple as much optical energy from the active emission layer 36 and into the first taper 76, as possible, but without introducing any parasitic reflections. Most preferably, the active emission layer 36 between the trenches 60 and 62 is aligned with the first taper 76 along the y (thickness) and x (width) directions and a gap 92 (FIG. 1D) between the first facet 21 of the gain means 12 and the first end 78 of the first taper 76 is minimized in order to minimize the divergence of the optical energy as the optical energy propagates between the first facet 21 and the first end 78. Typically, the gap 92 along the z direction (FIG. 1D) is on the order of 5 microns. After the gain means 12 is flip chip bonded to the cladding layer 24, the thermo-optical organic material 88 is applied to provide coverage without incorporating voids or bubbles. The thermo-optical organic material 88 fills the gap 92 between the first facet 21 of the gain means 12 and the first end 78 of the first taper 76, providing an advantageous index matching effect. To enable electrical connection to the n-contact 34 of the gain means 12, a portion of the thermo-optical organic material 88 is removed, preferably by reactive ion etching through a lithographically patterned mask, from a region above the gain means 12 which leaves a slot 94.

A first reflector 96 is fabricated in the first core 70 by using ultraviolet exposure of a portion of the first core 70 to form a periodic or structured reflector. If the optical energy is outputted from the second end 74, the first reflector 96 is preferably partially transmitting and partially reflecting at the operating wavelength. If the optical energy is outputted from the second facet 22, the first reflector 96 is preferably highly reflecting with 90% or more reflectivity. The first reflector 96 typically is a specialized Bragg grating of base periodicity from 0.2 to 0.6 microns, but with additional phase and amplitude structure periodically repeated with a period ($\Lambda_s$) from 50 to 500 $\mu$m, dependant on the material being written on or into, and the reflection spectrum desired. For example, if the material of the first core were silica, then the base periodicity of the first reflector 96 would be approximately 530 nanometers. Similarly, if the material of the first core were silicon, then the base periodicity of the first reflector 96 would be approximately 200 nanometers. Due to the periodic structure, the optical spectrum of the first reflector 96 exhibits multiple reflection peaks, known as a comb of peaks, in the wavelength domain of individually defined amplitude and wavelength spacing. The separation between adjacent peaks in the comb, $d\lambda$, is given by:

$$d\lambda = \lambda^2 / [2n_g \Lambda_s]$$

where $n_g$ is the effective group index. Basically, the separation between adjacent peaks in the comb is controlled by the period $\Lambda_s$ while the envelope containing the peaks depends on the grating modulation function inside one sampling period. The first reflector 96 may alternatively be a UV written or an etched grating and located either in, on, or adjacent to the first core 70 so long as the optical spectrum of the reflector exhibits the comb of peaks discussed above. The heaters 80 and 82 (FIG. 1D) associated with the reflector section 20 are also disposed on both sides of the first reflector 96 and the length of the heaters 80 and 82 exceeds the length of the first reflector 96 so that the entire length of the first reflector 96 can be maintained at a uniform temperature. The heaters 84 and 86 (FIG. 1D) associated with the phase control section 18 are also disposed on both sides of a reflector free portion of the first core 70 between the first taper 76 and the first reflector 96.

Referring now to FIG. 1D, the heaters 80, 82, 84, and 86 must generate sufficient thermal power so that the thermo-optical organic material 88 can modify the optical performance of the portion of the first core 70 between the heaters 84 and 86 and the first reflector 96 (collectively, Optical Elements) within a few milliseconds. The thickness of the thermo-optical organic material 88 disposed around the Optical Elements is important in determining the response time. If too thick, additional thermal power must be generated to change the index of refraction of the remaining thermo-optical organic material which does not modify the optical performance of the Optical Elements, but which increases the response time. If too thin, the thermo-optical organic material may overlap a smaller portion of the optical mode and may not be able to sufficiently modify an effective index in the Optical Elements. In this embodiment, the thickness of the thermo-optical organic material 88 disposed around the Optical Elements is at least 20 microns. Similarly, the cladding layer 24 beneath the heaters provides a degree of thermal isolation between the substrate and the heaters so that a larger fraction of the thermal power generated by the heaters modifies the optical performance of the Optical Elements rather than dissipates to the substrate 26. Given the different purposes, the cladding layer 24 preferably has different thicknesses beneath the gain means and beneath the heaters.

Referring again to FIG. 1D, the optical path of the tunable laser 10 is shown. In FIG. 1, optical energy propagates along the active emission layer 36 between the trenches 60 and 62, the first taper 76, and the first core 70 which collectively define an optical axis 98 within the tunable laser 10. The optical axis 98 is angled near the first facet 21 of the gain means 12 and near the second end 74 of the first core 70 so that the optical axis 98 traverses the intracavity interfaces such as 21 and 78 and the extracavity interfaces such as 74 at a non-normal angle so as to prevent parasitic reflections from degrading the performance of the tunable laser 10. The optical axis 98 is curved within the active emission layer 36 so that the second facet 22 of the gain means 18 forms one end and the reflector 96 (FIG. 1B) forms the other end of the laser cavity associated with the tunable laser 10. In order for the tunable laser 10 to lase, the gain associated with active emission layer 36 must be greater than losses associated with the gain means and the laser cavity. The losses associated with the laser cavity include, but are not limited to: the coupling losses between the first facet 21 and the first end 78, the coupling losses associated with the first taper 76, the losses propagating through the thermo-optical organic material 88 and the first waveguide 90, the reflection losses associated with the first reflector 96, the reflections at the interfaces 21 and 78, and any other parasitic reflections. Each loss element in the laser cavity shown should be no larger than a few decibels (dB) and preferably smaller than 0.5 dB so that the collective single pass loss along the optical axis 98 of the laser cavity is no larger than about 5 to 20 decibels.

Figure 2A:
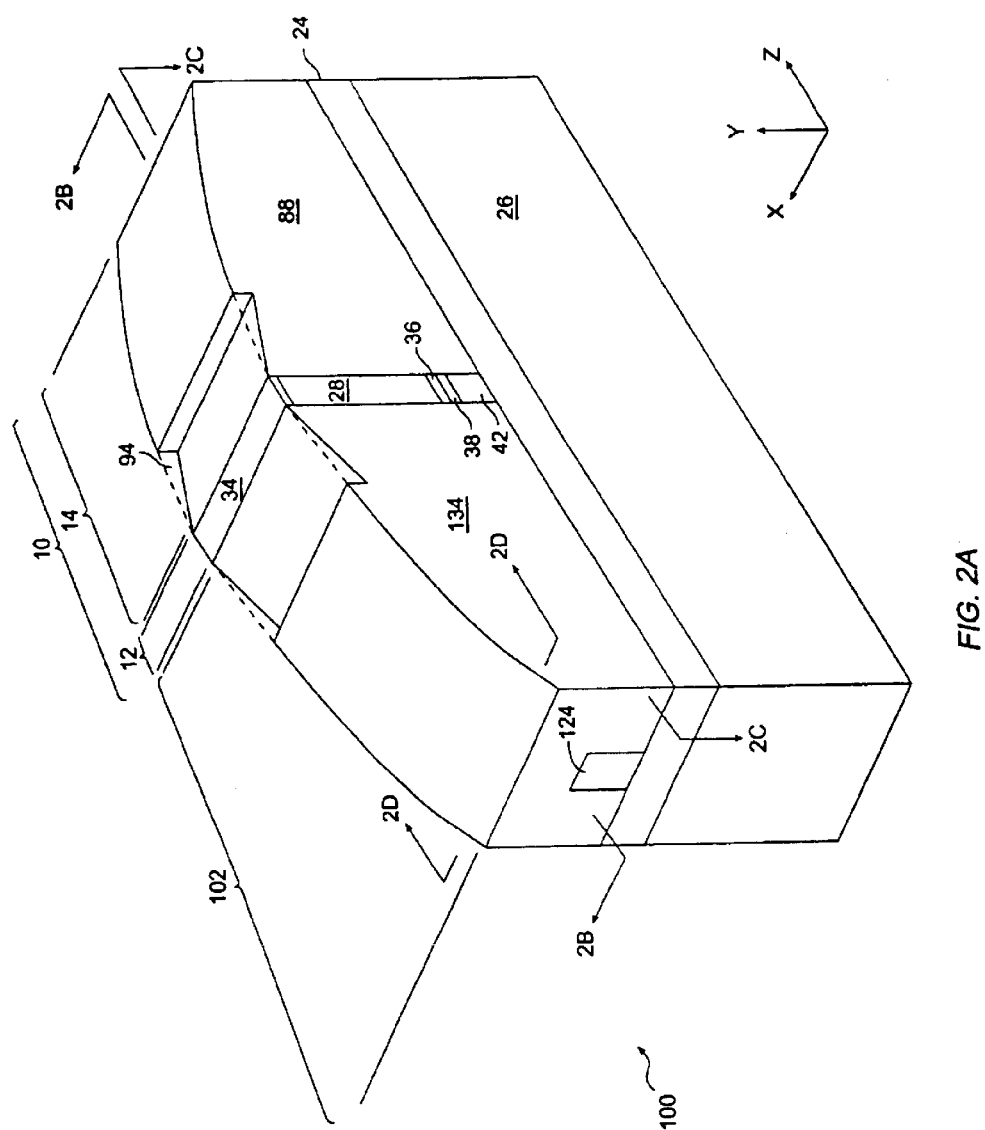
FIG. 2A is a right side elevational view of a second embodiment of a thermally wavelength tunable laser accordance with the principals of this invention.
Figure 2B:
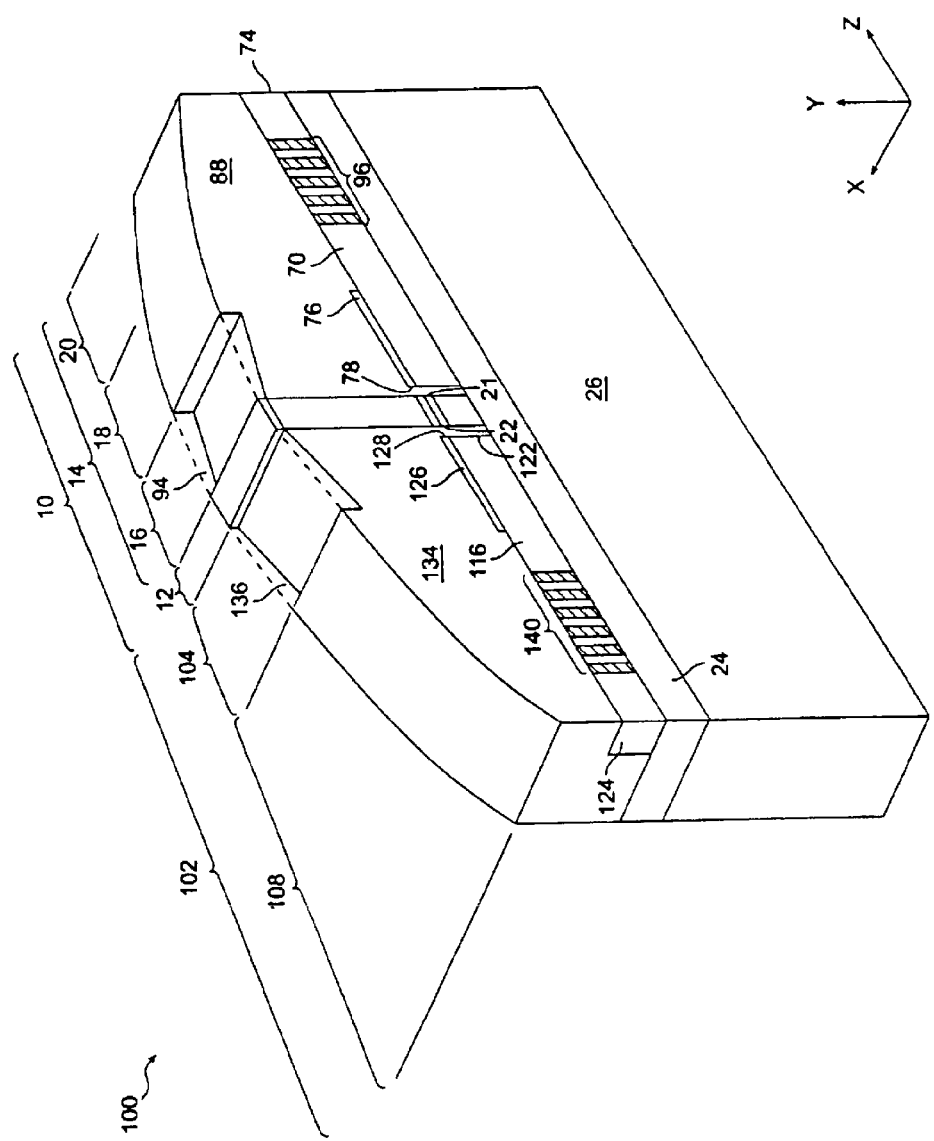
FIG. 2B is a right side elevational view along the line 2B—2B in FIG. 2A.

Referring now to FIGS. 2A and 2B where like elements are designated with like numerals, there is illustrated a second embodiment of the tunable laser 100. The tunable laser 100 includes the tunable laser 10 and, adjacent to the second facet 22 which is now AR coated, a second passive section 102. The second passive section 102 includes a second taper section 104 and a second reflector section 108 which are similar to those corresponding sections and elements within those sections in the passive section 14, described above.

Figure 2C:
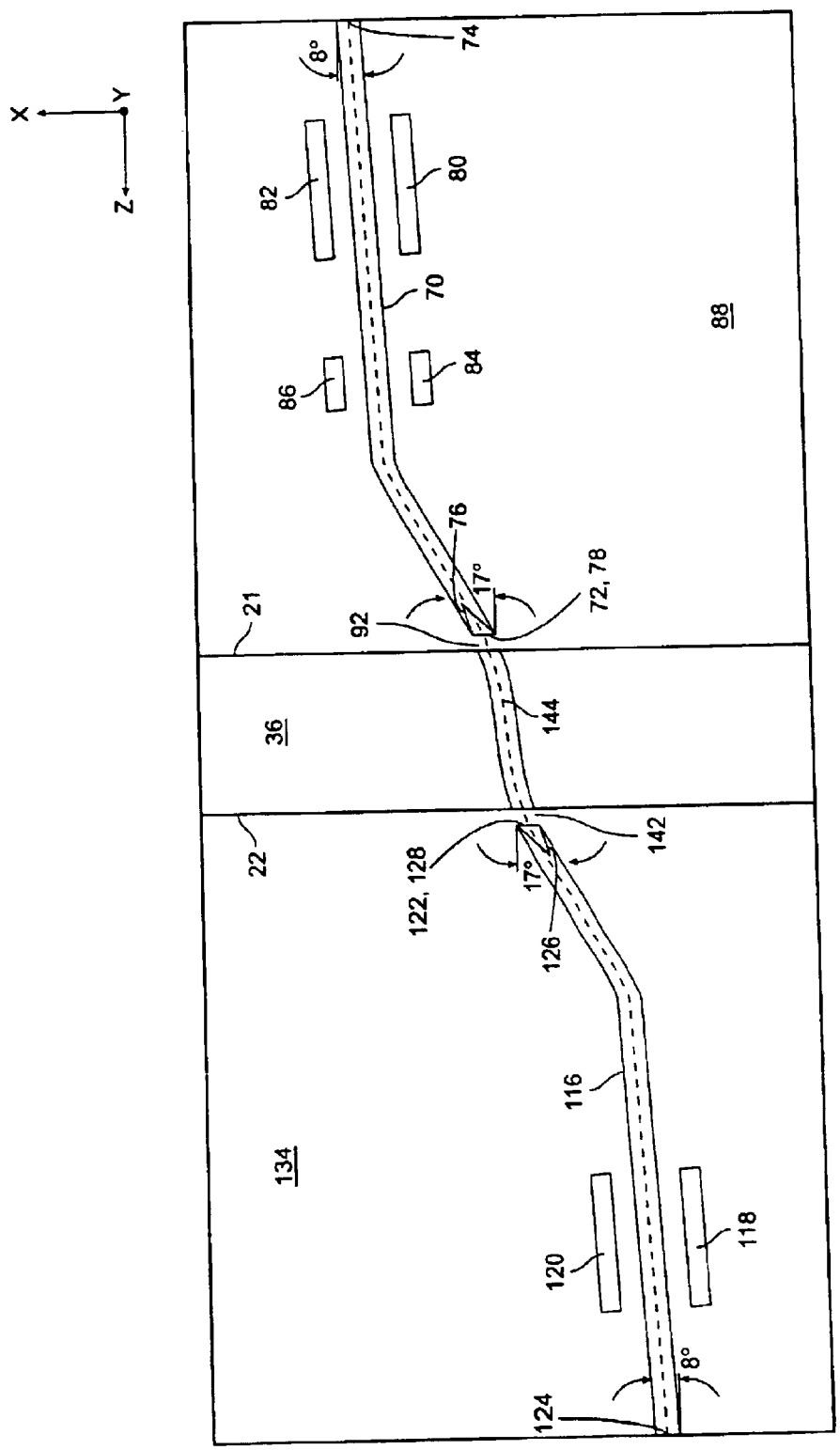
FIG. 2C is a diagrammatic representation of a top view along the line 2C—2C in FIG. 2A which follows the optical path of the thermally wavelength tunable laser.
Figure 2D:
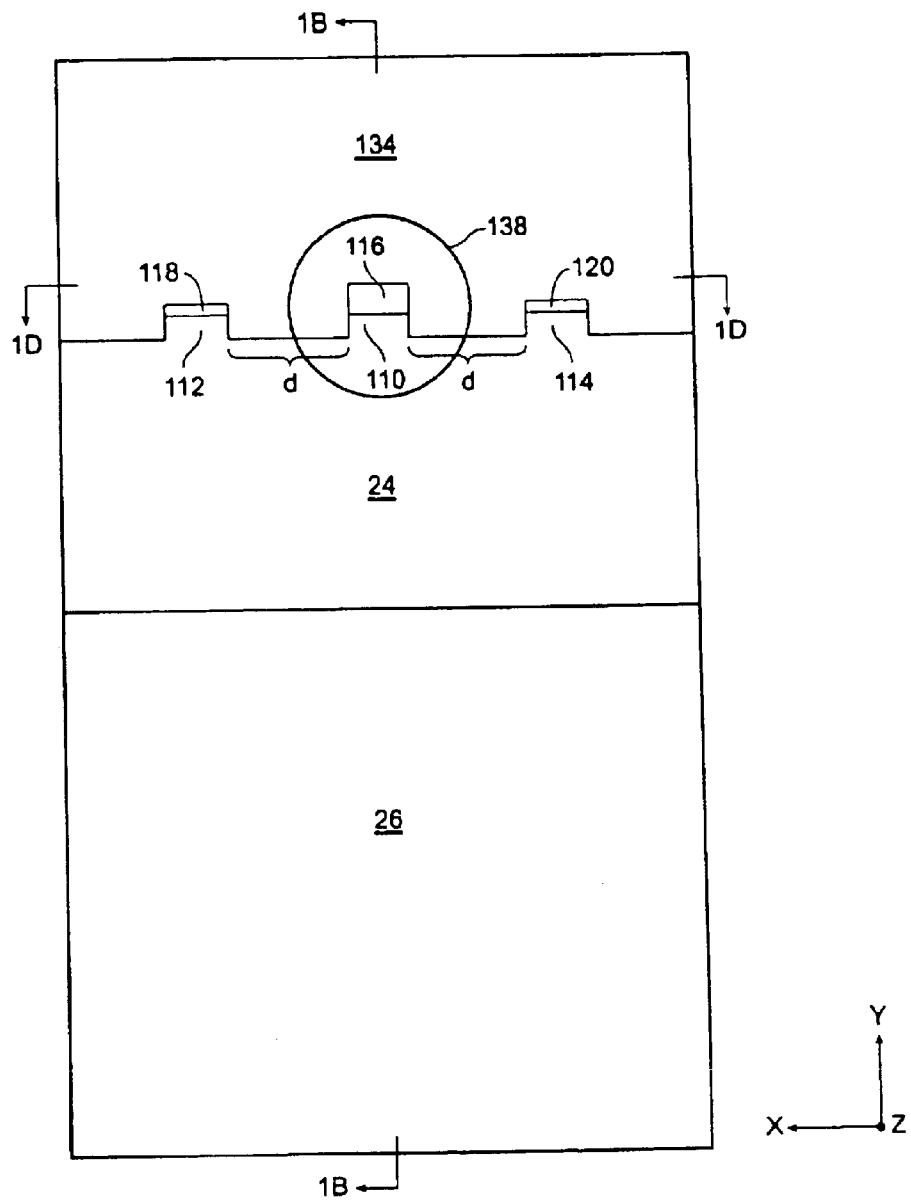
FIG. 2D is a front view of a first embodiment of the heaters and the waveguide along the line 2D—2D in FIG. 2A.
Figure 2E:
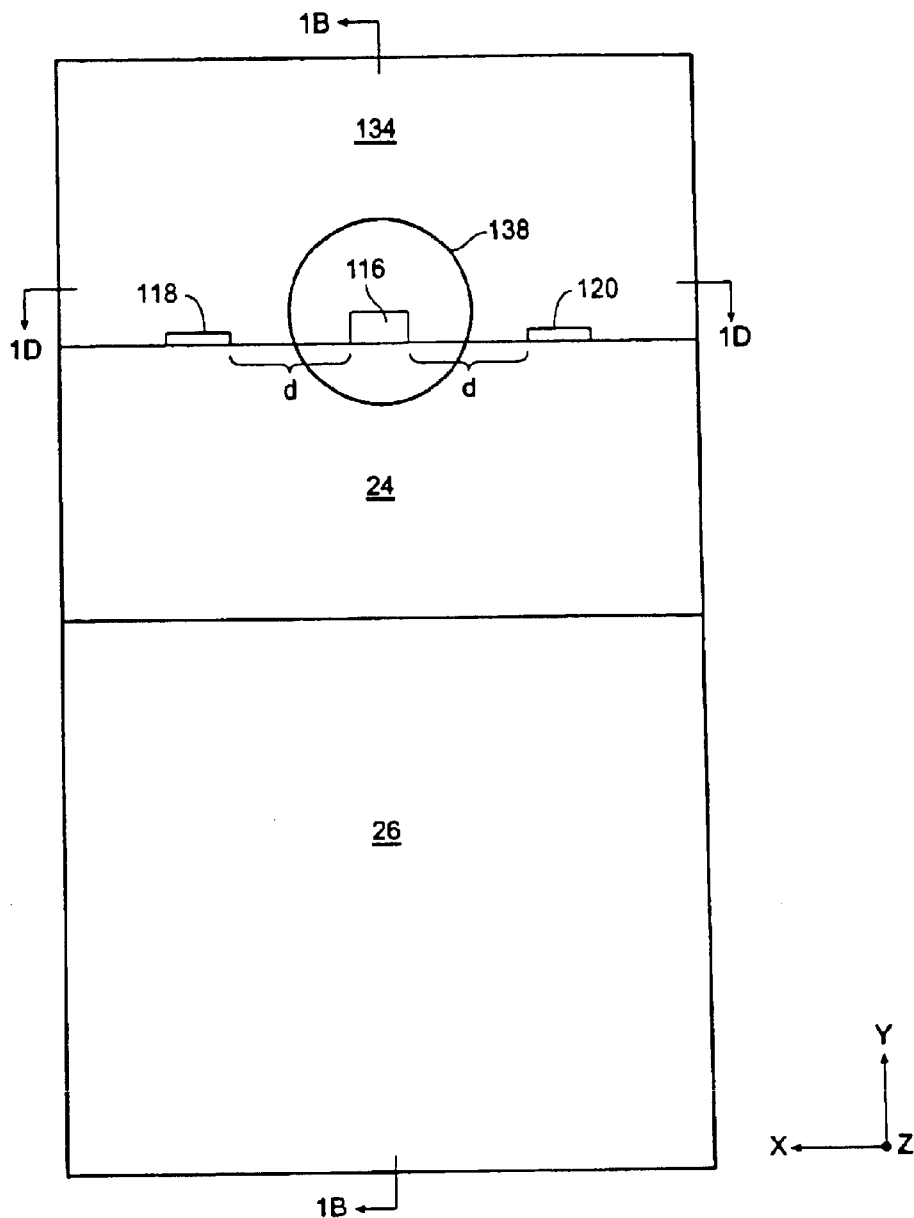
FIG. 2E is a front view of a second embodiment of the heaters and the waveguide along the line 2D—2D in FIG. 2A.

Referring now to FIGS. 2D and 2E, embodiments of the heaters and the waveguide associated with the second reflector section 108 are shown and are similar to the one shown in FIGS. 1E and 1F. Referring now to FIG. 2D, the cladding layer 24 is etched to produce pedestals 110, 112, and 114 and upon these pedestals are, respectively, deposited a second core 116 and heaters 118 and 120. As best shown in FIG. 2B, the second core 116 includes a first end 122 with an AR coating to prevent back reflection and a second end 124 which may have an AR coating or a partially reflective and partially transmissive coating thereon depending on whether optical energy exits the tunable laser 100 via the second end 124 or the second end 74. A second taper 126 is formed on the top surface of the second core 116 and a first surface 128 of the second taper 126 is aligned with that portion of the gain means 12 that is between the trenches 60 and 62 so as to couple as much optical energy produced by the gain means 12 as possible into the second core 116. Most preferably, the first surface 128 is aligned with the active emission layer 36 between trenches 60 and 62 along the y (thickness) and x (width) directions and a gap 142 (FIG. 2C) between the second facet 22 and the first end 128 is minimized in order to minimize the divergence of the optical energy as the optical energy propagates between the second facet 22 and the first end 128. Typically, the gap 142 along the z direction is on the order of 5 microns. Alternatively, if the second taper 128 is incorporated into the gain means 12 or the gain means 12 and the second waveguide 138, discussed below, are such that the size of the optical mode propagating from the active emission layer 36 and into and then along the second waveguide 138 remains constant and with minimal optical loss, then the first end 122 would no longer be AR coated and would be aligned with that portion of the active layer 36 that is between the trenches 60 and 62.

Referring once again to FIG. 2D, a thermo-optical organic material 134 which is the same as that described for the thermo-optical organic material 88, is applied preferably by spinning onto and over the heaters 118 and 120, the second core 116, and onto the cladding layer 24. Referring now to FIG. 2C, the thermo-optical organic material 134 fills the gap 142 between the gain means 12 and the first end 128, providing an advantageous index matching effect. Referring now to FIG. 2B, reactive ion etching through a lithographically patterned mask is preferably used to remove a region of the thermo-optical organic material 134 near the gain means 12 thereby leaving a slot 136 to enable electrical connection to n-contact 34 of the gain means 12.

Referring now to FIG. 2D, a second waveguide 138 includes the second core 116, portions of the thermo-optical organic material 134 adjacent to the second core 116, and portions of the cladding layer 24 beneath the second core 116, as shown in FIG. 2D and 2E. The diameter of the second waveguide 138 encompasses essentially all the optical mode. The mode size and shape is dependant upon the temperature of the thermo-optical organic material 134 adjacent to the second core 116. At room temperature and with the heaters off, the index of refraction of the thermo-optical organic material 134 is at its highest, but is lower than the index of the second core 116. The optical mode under these conditions will be in the second core 116 and will be partially in both the thermo-optical organic material 134 and the cladding layer 24. With the heaters 118 and 120 (FIG. 2D) on, the temperature of the thermo-optical organic material 134 adjacent to the second core 116 increases and the index of refraction of the thermo-optical organic material 134 adjacent to the second core 116 decreases. Under these conditions, the optical mode will have "sunk" towards the cladding layer 24 when compared to the location of the optical mode at room temperature. As portions of the thermo-optical organic material 134 adjacent to the second core 116 and along the z-axis (FIG. 2D) are heated while other portions remain at room temperature, the size and shape of the optical mode along the z direction of the second core 116 changes, but the change is preferably gradual, adiabatic, and therefore with minimal optical loss.

Referring now to FIG. 2B, a second reflector 140 is fabricated in the second core 116 by using ultraviolet exposure of a portion of the second core 116. The second reflector 116 typically is a specialized Bragg grating of base periodicity from 0.2 to 0.6 microns, but with additional phase and amplitude structure periodically repeated with a period ($\Lambda_s$) from 50 to 500 µm, dependant on the material being written on or into, and the reflection wavelength desired. Due to the periodic structure, the optical spectrum of the second reflector 116 exhibits multiple reflection peaks, known as a comb of peaks, in the wavelength domain of individually defined amplitude and wavelength spacing. The separation between adjacent peaks in the comb, dλ, is given by:

$$d\lambda = \lambda^2 / [2n_g \Lambda_s]$$

where $n_g$ is the effective group index. Basically, the separation between adjacent peaks in the comb is controlled by the period $\Lambda_s$ while the envelope containing the peaks depends on the grating modulation function inside one sampling period. The heaters 118 and 120 (FIG. 2C) associated with the second reflector section 108 are also disposed on both sides of the second reflector 140 and the length of the heaters 118 and 120 exceed the length of the second reflector 140 so that the entire length of the second reflector 140 can be maintained at a uniform temperature.

Referring now to FIG. 2C, the optical path of the tunable laser 100 is shown. In FIG. 2, the optical energy propagates along the second taper 126, the second core 116, the active layer 36 between the trenches 60 and 62, the first taper 76, and the first core 70 which collectively define an optical axis 144. The optical axis 144 is angled in the tunable laser 10 as described above. In the second passive section 102 of the tunable laser 100, the optical axis 144 is angled near the second facet 22 of the gain means 12 and near the second end 124 of the second core 116 so that the optical axis 144 transverses the intracavity interfaces such as 22 and 124 and the extracavity interfaces such as 128 at non normal angles so as to prevent parasitic reflections from degrading the performance of the tunable laser 100. The second reflector 140 (FIG. 2B) forms one end and the first reflector 96 (FIG. 2B) forms the other end of the laser cavity associated with the tunable laser 100. In order for the tunable laser 100 to lase, the gain associated with the active emission layer 36 must be greater than the losses associated with gain means 12 and the laser cavity, namely, the passive section 14 and the second passive section 102. Each loss element in the laser cavity shown should be no larger than a few decibels (dB) and preferably smaller than 0.5 dB so that the collective single pass loss along the optical axis 144 of the laser cavity is no larger than about 5–20 decibels.

Figure 3A:
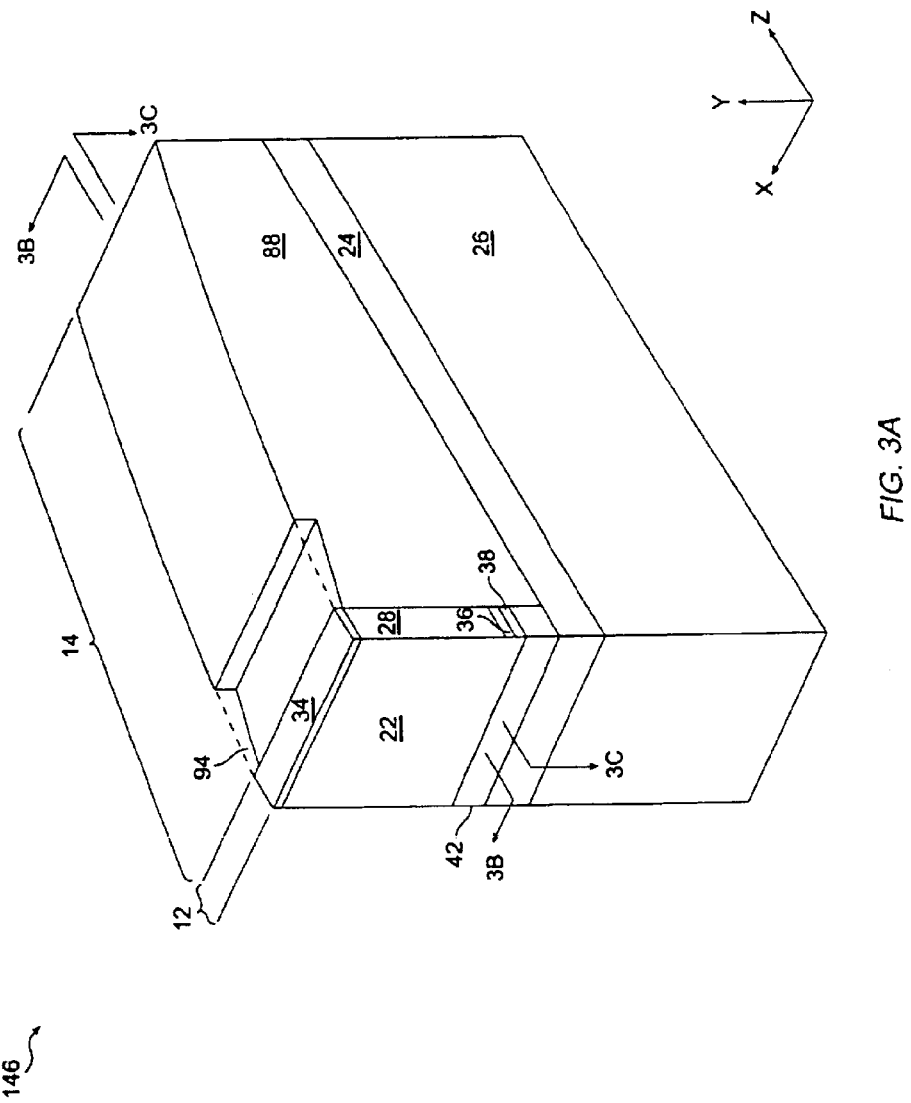
FIG. 3A is a right side elevational view of a third embodiment of a thermally wavelength tunable laser according with the principals of this invention.
Figure 3B:
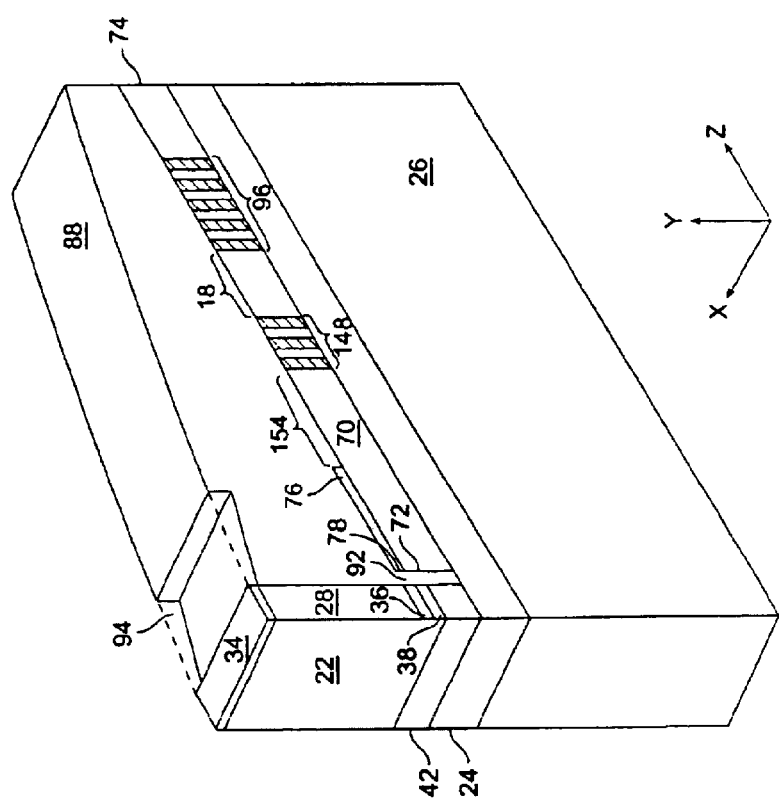
FIG. 3B is a side view along the line 3B—3B in FIG. 3A.

Referring now to FIGS. 3A and 3B where like elements are designated with like numerals, a third embodiment of the tunable laser 146 is shown. The third embodiment of the tunable laser 146 is substantially similar to the tunable laser 10 shown in FIG. 1, but includes several additional elements not found in the tunable laser 10. Referring to FIG. 3B, the tunable laser 146 includes a second reflector 148 fabricated in or on the first core 70 between the first taper 76 and the first reflector 96. The second reflector 148 is fabricated into the first core 70 using ultraviolet exposure and the second reflector 148 is typically a specialized Bragg grating of base periodicity from 0.2 to 0.6 microns, but with additional phase and amplitude structure periodically repeated with a period ($\Lambda_s$) from 50 to 500 µm, dependant on the material being written on or into, and the reflection wavelength desired. Due to the periodic structure, the optical spectrum of the second reflector 148 exhibits multiple reflection peaks, known as a comb of peaks, in the wavelength domain of individually defined amplitude and wavelength spacing. The separation between adjacent peaks in the comb, dλ, is given by:

$$d\lambda = \lambda^2 / [2n_g \Lambda_s]$$

where $n_g$ is the effective group index. Basically, the separation between adjacent peaks in the comb is controlled by the period Λ, while the envelope containing the peaks depends on the grating modulation function inside one sampling period. A pair of heaters 150 and 152 (FIG. 3C) associated with the second reflector 148 are also disposed on both sides of the second reflector 148 and the length of the heaters 152 and 152 exceed the length of the second reflector 148 so that the entire length of the second reflector 148 can be maintained at a uniform temperature. The first phase control section 18 is located between the first reflector 96 and the second reflector 148 and the heaters 84 and 86 (FIG. 3C) associated with the first phase control section 18 are disposed on both sides of a reflector free portion of the first core 70 between the first and second reflectors. A second phase control section 154 is located between the first taper 76 and the second reflector 148 and heaters 156 and 158 (FIG. 3C) associated with the second phase control section 154 are disposed on both sides of a portion of a reflector free portion of the first core 70 between the first taper and the second reflector.

The dynamic operation of the tunable laser 100 shown in FIG. 2 shall now be discussed. Amplification current supplied to the bonding layer 34 (FIG. 1C) and the portion of the bonding layer 56 (FIG. 1C) in electrical contact with the active layer 36 between the trenches 60 and 62 (FIG. 1C) causes population inversion in the active layer 36 (FIG. 1C) and gain in the laser cavity of the tunable laser 100. When the round trip gain in the laser cavity of the tunable laser 100 exceeds the round trip losses, the tunable laser 100 will lase along the optical axis 144. The laser cavity of the tunable laser 100 will have a gain curve 160 and the Fabry-Perot resonant cavity modes 162, 164, and 166 shown schematically in FIG. 4. Optical energy will propagate from the active layer 36 between trenches 60 and 62, through the gaps 98 and 142, through the first and second tapers 76 and 126, and into the first and second cores 70 and 116. Since the optical path 144 near the first and second facets 21 and 22 and the front surfaces 78 and 128 are angled, parasitic reflections should be minimized and most of the optical energy should propagate into the first and second cores 70 and 116. The first and second tapers 76 and 126 will optically transmit optical energy into the respective first and second cores 70 and 116 and to the respective first and second reflector 96 and 140. The first reflector 96 reflects the optical energy if the wavelength associated with the optical energy is one of a first plurality of reflection wavelengths and passes all other optical energy. The reflection spectrum of the first reflector 96 is shown in FIG. 5A and, as shown in FIG. 5A, the first reflector 96 generates the "comb of peaks," namely, a comb shaped reflective spectrum 168 with a reflection peak 172, 174, and 176 at a separate wavelength. Similarly, the second reflector 140 reflects the optical energy if the wavelength associated with the optical energy is one of a second plurality of reflection wavelengths and passes all other optical energy. The reflection spectrum of the second reflector 140 is shown in FIG. 5B and, as shown in FIG. 5B, the second reflector 140 generates a comb shaped reflective spectrum 178 with a reflection peak 182, 184, and 186 at a separate wavelength.

Figure 4:
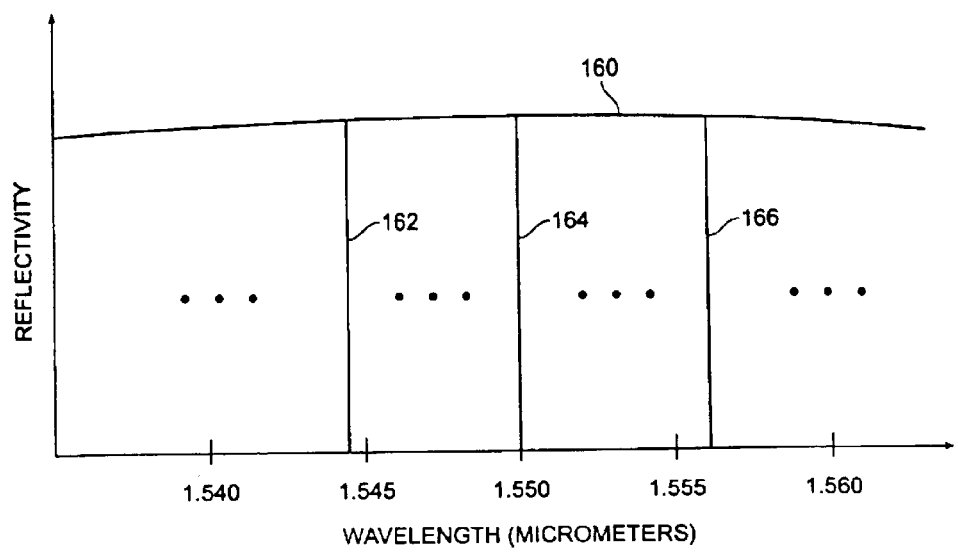
FIG. 4 is a diagrammatic representation of the Fabry-Perot resonant cavity modes and the gain envelop associated with the tunable laser shown in FIG. 2.
Figure 5A:
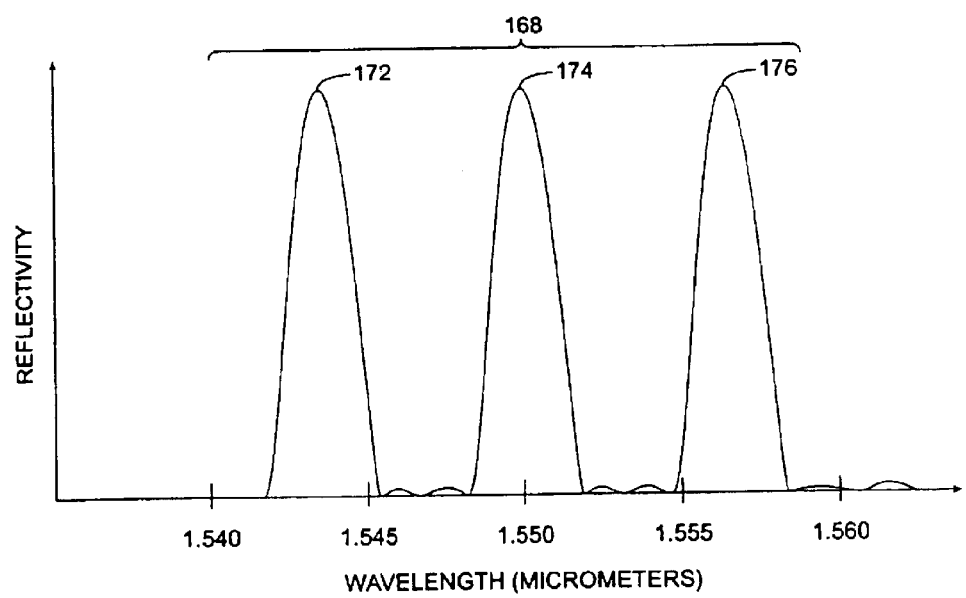
FIG. 5A is a diagrammatic representation of the reflection spectrum associated with the first reflector in the thermally wavelength tunable laser shown in FIG. 2.
Figure 5B:
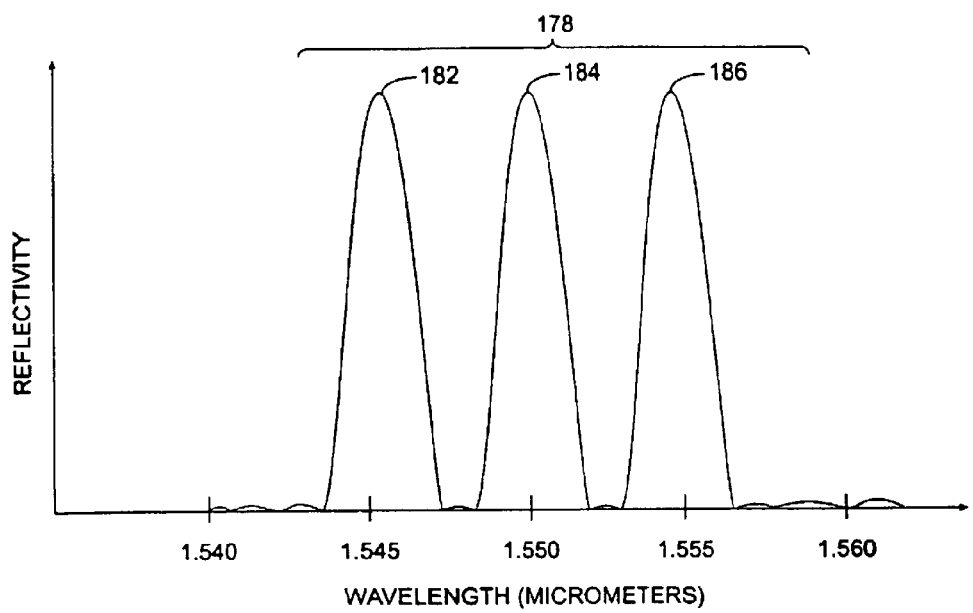
FIG. 5B is a diagrammatic representation of the reflection spectrum associated with the second reflector in the thermally wavelength tunable laser shown in FIG. 2.
Figure 6A:
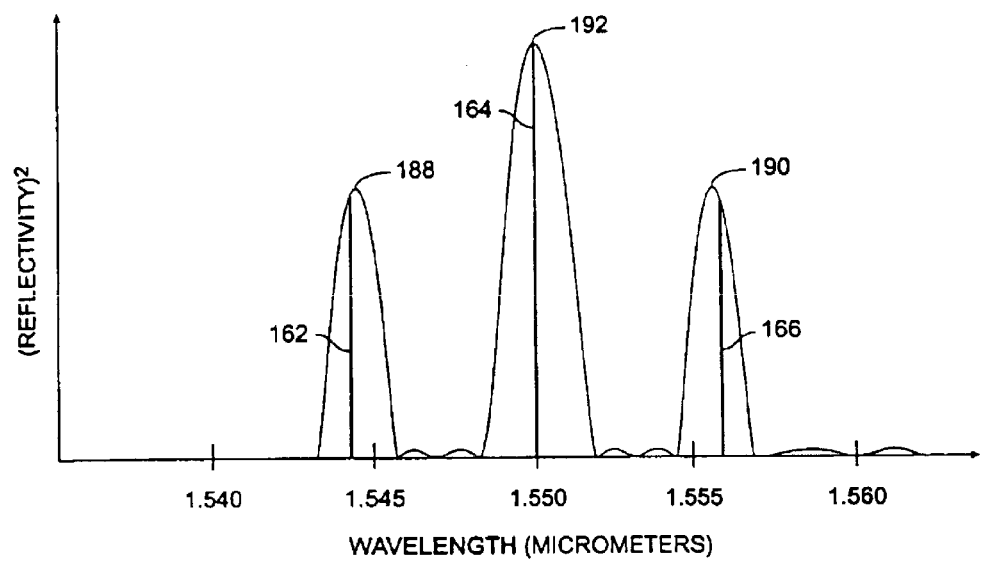
FIG. 6A is a diagrammatic representation of the product of the reflection spectrums associated with the first reflector shown in FIG. 5A and with the second reflector shown in FIG. 5B, the selected reflection peaks showing the Fabry-Perot resonant cavity modes located therein.

Referring now to FIG. 6A which is the product of the reflection spectrum in FIG. 5A and the reflection spectrum in FIG. 5B with the Fabry-Perot resonant cavity modes from FIG. 4, the overlap of reflection peaks 172, 174, and 176 associated with the first reflector 96 with the reflection peaks 182, 184, and 186 associated with the second reflector 140 is shown. Specifically, the reflection peaks 172 and 176 partially overlap with the reflection peaks 182 and 186 producing the composite reflection peaks 188 and 190 and the reflection peak 174 substantially overlaps with the reflection peak 184 producing the composite reflection peak 192. The tunable laser 100 may lase if there is a Fabry-Perot resonant cavity mode located within the range of wavelengths associated with the composite reflection peaks 188, 190, and 192 and the proper gain conditions exist. As shown in FIG. 6A, the Fabry-Perot resonant cavity mode 164 is located within the range of wavelengths associated with the composite reflection peak 192, the Fabry-Perot resonant cavity mode 162 is located within the range of wavelengths associated with the composite reflection peak 188, and the Fabry-Perot resonant cavity mode 166 is located within the range of wavelengths associated with the composite reflection peak 190. Since the magnitude of the reflectivity of the composite reflection peaks 188 and 190 are significantly smaller than that of the composite reflection peak 192, the tunable laser 100 will lase preferentially at the wavelength associated with Fabry-Perot resonant cavity mode 162. There will be a small amount of light generated at the Fabry-Perot resonant cavity modes 162 and 166, but the intensity of this light is suppressed by the mode suppression ratio which is related to the ratio of the round trip losses at the respective wavelengths and the laser design. Accordingly, the tunable laser 100 will lase at the wavelength associated with the Fabry-Perot resonant cavity mode 164.

Figure 6B:
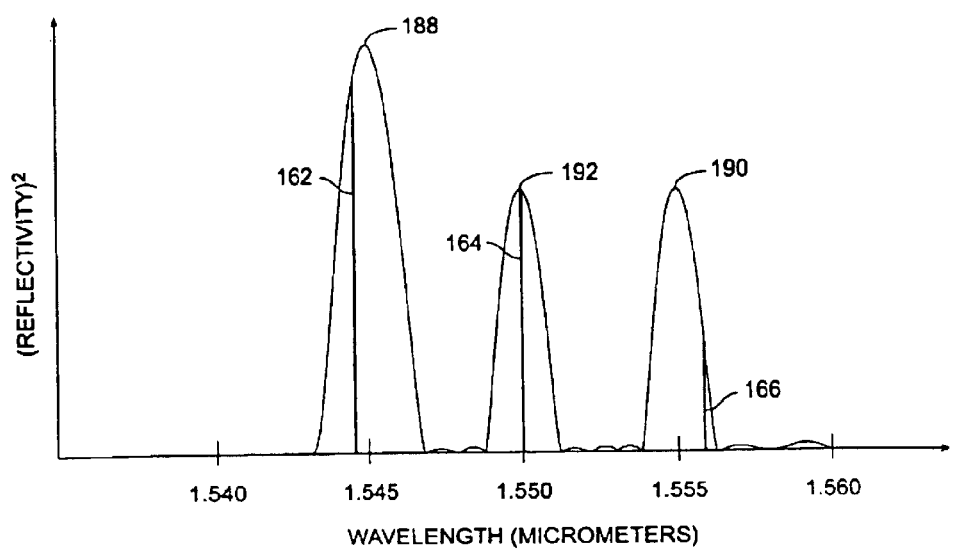
FIG. 6B is a diagrammatic representation of the selected reflection peaks shown in FIG. 6A having been shifted in wavelength due to thermal tuning of the first and second reflectors.
Figure 6C:
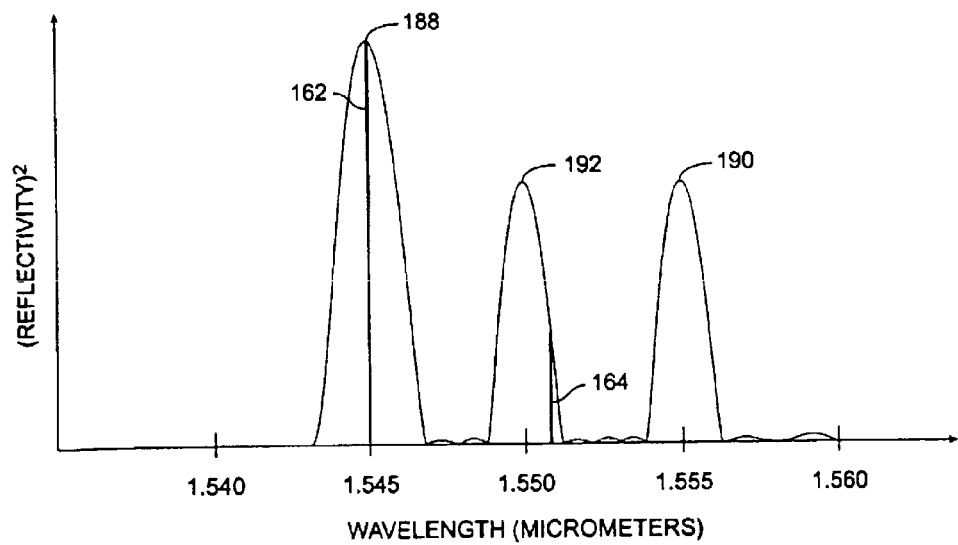
FIG. 6C is a diagrammatic representation of the selected Fabry-Perot resonant cavity modes shown in FIG. 6B having been shifted due to thermal tuning in the phase control section.

To change the lasing wavelength of the tunable laser 100 and as shown in FIG. 6B, current is supplied to the heaters 80 and 82 in the reflector section 20 and to the heaters 118 and 120 in the second reflector section 108, thereby heating some or all of these heaters. This heats and changes the index of refraction of the thermo-optical organic material 88 and 134 adjacent to the first and second reflectors 96 and 140 thereby shifting the respective reflection spectrums 168 and 178 such that reflection peaks 172 and 182 substantially overlap thereby substantially increasing the magnitude of the reflectivity of the composite reflection peak 188, reflection peaks 174 and 184 partially overlap thereby substantially decreasing the magnitude of the reflectivity of the composite reflection peak 192, and reflection peaks 176 and 186 still partially overlap thereby maintaining the magnitude of the reflectivity of the composite reflection peak 190. However, the wavelength associated with the Fabry-Perot resonant cavity mode 162 and the composite reflection peak 188 is not optimal to produce maximum optical intensity of the output optical energy of the tunable laser 100. To solve this problem and as shown in FIG. 6C, current is supplied to some or all of the heaters 84 and 86 in the phase control section 18 thereby heating the heaters and heating and changing the index of refraction of the thermo-optical organic material 88 and 134 in and near the first and second cores 70 and 116 thereby shifting the wavelengths associated with the Fabry-Perot resonant cavity modes. The tunable laser 100 will then lase at the wavelength associated with the Fabry-Perot resonant cavity mode 162.

Figure 3C:
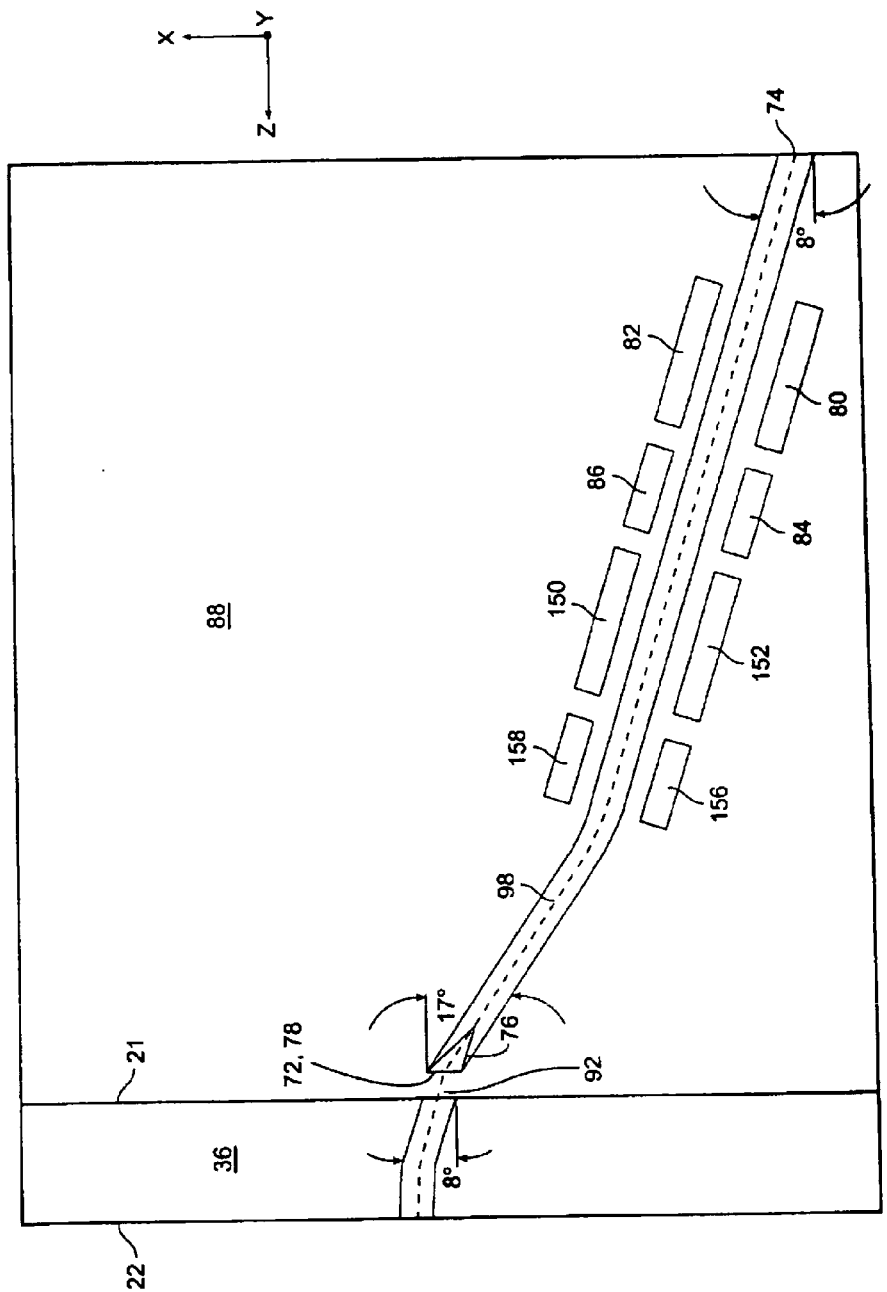
FIG. 3C is a diagrammatic representation of a top view along the line 3C—3C in FIG. 3A which follows the optical path of the thermally wavelength tunable laser.
Figure 7A:
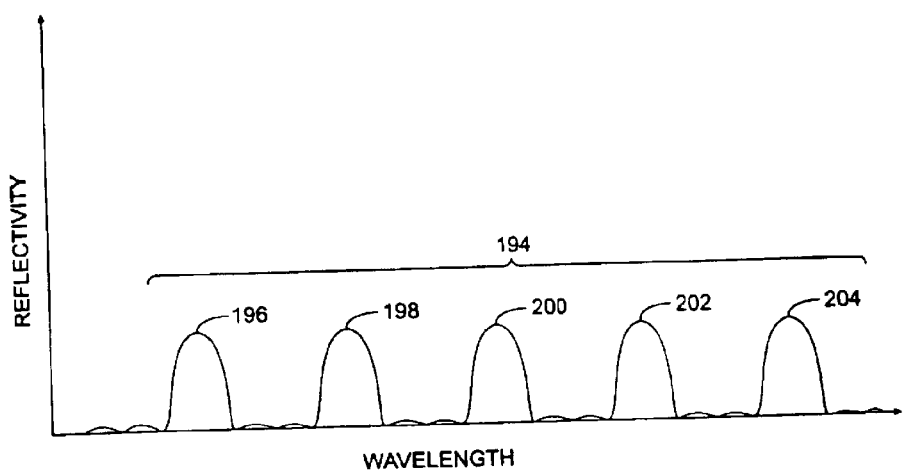
FIG. 7A is a diagrammatic representation of the reflection spectrum associated with the first reflector in the thermally wavelength tunable laser shown in FIG. 3.

The dynamic operation of the tunable laser 146 shown in FIG. 3 shall now be discussed. Amplification current supplied to the bonding layer 34 (FIG. 1C) and the portion of the bonding layer 56 (FIG. 1C) in electrical contact with the optical axis 98 in the active emission layer 36 (FIG. 1C) causes population inversion in the active emission layer 36 (FIG. 1C) and gain in the laser cavity of the tunable laser 146. When the round trip gain in the laser cavity of the tunable laser 146 exceeds the round trip losses, the tunable laser 146 will lase along the optical axis 98 (FIG. 3C). The laser cavity of the tunable laser 146 will have a gain curve (not shown). Optical energy will propagate from the active emission layer 36 between trenches 60 and 62, through the gap 98, through the first taper 76, and into the first waveguide 90. Since the optical path 98 (FIG. 3C) near the first facet 21 and the front surface 78 is angled, parasitic reflections should be minimized and most of the optical energy should propagate into the first core 70. The first taper 76 will optically transmit optical energy into the first core 70 and to the first and second reflector 96 and 148 (FIG. 3B). The first reflector 96 reflects the optical energy if the wavelength associated with the optical energy is one of a first plurality of reflection wavelengths and passes all other optical energy. The reflection spectrum of the first reflector 96 is shown in FIG. 7A and, as shown in FIG. 7A, the first reflector 96 generates a comb shaped reflective spectrum 194 with reflection peaks 196, 198, 200, 202, and 204 at different wavelengths. Similarly, the second reflector 148 reflects the optical energy if the wavelength associated with the optical energy is one of a first plurality of reflection wavelengths and passes all other optical energy. The reflection spectrum of the second reflector 148 is shown in FIG. 7B and, as shown in FIG. 7B, the second reflector 148 generates a comb shaped reflective spectrum 206 with reflection peaks 208 and 210 at different wavelengths.

Figure 7B:
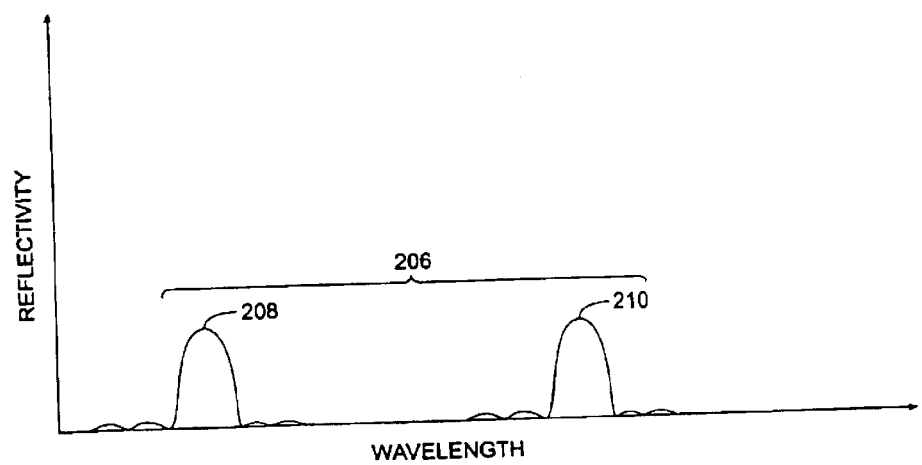
FIG. 7B is a diagrammatic representation of the reflection spectrum associated with the second reflector in the thermally wavelength tunable laser shown in FIG. 3.
Figure 8A:
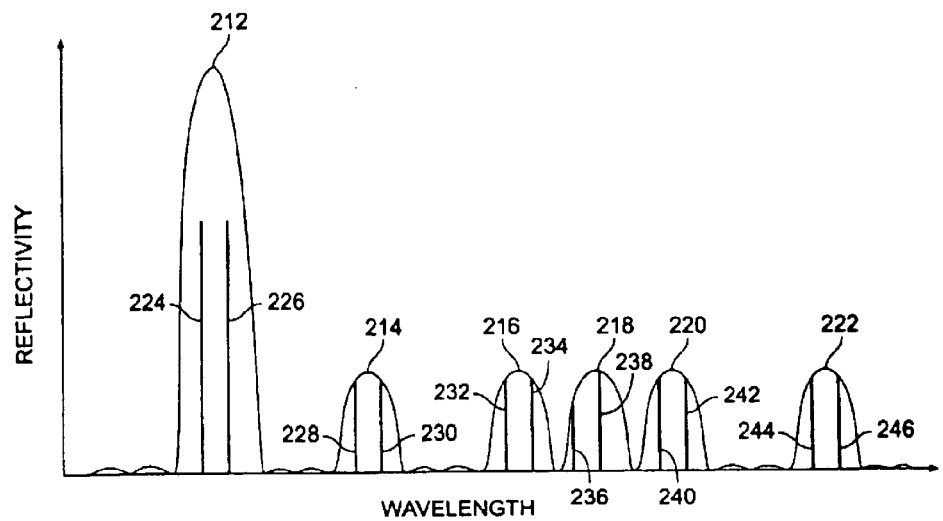
FIG. 8A is a diagrammatic representation of the coherent addition of the reflection spectrums associated with the first reflector shown in FIG. 7A and the second reflector shown in FIG. 7B, all reflection peaks showing the Fabry-Perot resonant cavity modes located therein.
Figure 8B:
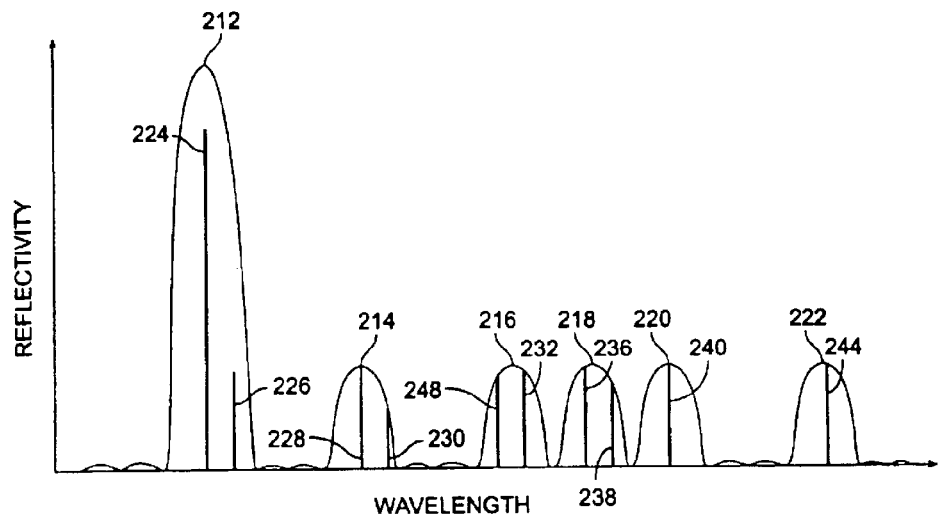
FIG. 8B is a diagrammatic representation of select Fabry-Perot resonant cavity modes within the composite reflection spectrum shown in FIG. 8A having been shifted due to thermal tuning in the appropriate phase control sections.

Referring now to FIG. 8A, a composite reflection spectrum is shown and which is obtained from the coherent addition of the reflection spectrum associated with the first reflector 96 shown in FIG. 7A with the reflection spectrum associated with the second reflector 148 shown in FIG. 7B. A composite reflection peak 212 is formed by the optimally phased coherent addition of light waves reflected from the first and second reflectors whose spectral amplitudes are described by the reflection peaks 196 and 204. The composite reflection peak 212 is given by the square of the sum of the square roots of the reflection peaks 196 (FIG. 7A) and 208 (FIG. 7B) while composite reflection peaks 214, 216, 218, 220, and 222 correspond, respectively, to the simple reflection associated with reflection peaks 198, 200, 210, 202, and 204. The laser cavity of the tunable laser 146 will have Fabry-Perot resonant cavity modes 224, 226, 228, 230, 232, 234, 236, 238, 240, 242, 244, 246, and 248. The coherent sum of the two reflected waves is shifted in phase relative to each other so that the positions of the Fabry-Perot resonant cavity modes 224 and 226 are shifted relative to the positions of all the other Fabry-Perot resonant cavity modes. In order for the tunable laser 146 to lase and as shown in FIG. 8B, current is supplied to some or all of the heaters 80 and 82 in the reflector section 20, to the heaters 118 and 120 in the second reflector section 108, to the heaters 84 and 86 in the phase control section 18, and to the heaters 156 and 158 in the second phase control section 154 thereby aligning the Fabry-Perot resonant cavity mode 224 to the peak of the composite reflection peak 212. The tunable laser 146 will then lase at the wavelength associated with the Fabry-Perot resonant cavity mode 224.

Numerous variations and modifications will become apparent to those skilled in the art once the above disclosure is fully appreciated. It is intended that the following claims be interpreted to embrace all such variations and modifications.

What is claimed is:

1. A tunable laser, comprising:
   a gain medium having an active emission layer to generate optical energy, the active emission layer having a first and a second facet;
   a first waveguide extending from the first facet, the first waveguide including a first core, the first core having a first end adjacent to the first facet for receiving optical energy, the first core fabricated from inorganic material and the first waveguide including inorganic material and thermo-optical organic material surrounding the first core;
   a second waveguide extending from the second facet, the second waveguide including a second core, the second core having a first end adjacent to the second facet for receiving optical energy, the second core fabricated from inorganic material and the second waveguide including inorganic material and thermo-optical organic material surrounding the second core;
   a substrate supporting the first waveguide, the second waveguide, and the gain means;
   a first reflector positioned to reflect optical energy propagating along the first waveguide if the optical energy has a wavelength that is one of a plurality of first reflection wavelengths;
   a second reflector positioned to reflect optical energy propagating along the second waveguide if the optical energy has a wavelength that is one of plurality of second reflection wavelengths;
   a thermo-optical organic material positioned to shift the plurality of first and second reflection wavelengths in response to changes of temperature in the thermo-optical organic material; and
   a first thermal actuator thermally coupled to change the temperature in the thermo-optical organic material.

2. The tunable laser of claim 1 wherein the first waveguide includes a reflector-free portion interposed between the first end of the first core and the first reflector, the reflector-free portion including a phase control section.

3. The tunable laser of claim 2 further comprising thermo-optical organic material positioned in proximity to the phase control section.

4. The tunable laser of claim 3 wherein the thermo-optical organic material has a coefficient of refractive index variation as a function of temperature, the magnitude of which exceeds $1 \times 10^{-4}/°C$.

5. The tunable laser of claim 3 wherein the thermo-optical organic material is selected from the group comprising a polymer derived from methacrylate, a polymer derived from siloxane, a polymer derived from carbonate, a polymer derived from styrene, a polymer derived from cyclic olefin, and a polymer derived from norbornene.

6. The tunable laser of claim 1 wherein the first thermal actuator is selected from the group comprising a resistive heater, a thermoelectric heater, and a thermoelectric cooler.

7. The tunable laser of claim 3 wherein the first thermal actuator is coupled to change the temperature in the thermo-optical organic material adjacent to the phase control section, and further comprising:
   a second thermal actuator is coupled to change the temperature in the thermo-optical organic material adjacent to the first reflector; and
   a third thermal actuator is coupled to change the temperature in the thermo-optical organic material adjacent to the second reflector.

8. A tunable hybrid laser, comprising:
   a substrate fabricated of a first material;
   a gain medium fabricated of a second material and mounted onto the substrate, the gain medium including an active emission layer to generate optical energy, the active emission layer having a first and a second facet;
   a first waveguide disposed on the substrate and extending from the first facet, the first waveguide including a first core, the first core having a first end adjacent to the first facet for receiving optical energy, the first core fabricated from inorganic material and the first waveguide including inorganic material and thermo-optical organic material surrounding the first core;
   a first reflector positioned to reflect optical energy propagating along the first waveguide if the optical energy has a wavelength that is one of a plurality of first reflection wavelengths;
   a second waveguide disposed on the substrate and extending from the second facet, the second waveguide including a second core, the second core having a first end adjacent to the second facet for receiving optical energy, the second core fabricated from inorganic material and the second waveguide including inorganic material and thermo-optical organic material surrounding the second core;
   a second reflector positioned to reflect optical energy propagating along the second waveguide if the optical energy has a wavelength that is one of a plurality of second reflection wavelengths;
   a thermo-optical organic material positioned to shift the plurality of first and second reflection wavelengths in response to changes of temperature in the thermo-optical organic material; and
   a first thermal actuator thermally coupled to change the temperature in the thermo-optical organic material.

9. The tunable hybrid laser of claim 8 wherein the first waveguide includes a reflector-free portion interposed between the first end of the first core and the first reflector, the reflector-free portion including a phase control section.

10. The tunable hybrid laser of claim 9 further comprising thermo-optical organic material positioned in proximity to the phase control sections.

11. The tunable hybrid laser of claim 8 wherein the first thermal actuator is selected from the group comprising a resistive heater, a thermoelectric heater, and a thermoelectric cooler.

12. The tunable hybrid laser of claim 9 wherein the first thermal actuator is coupled to change the temperature in the thermo-optical organic material adjacent to the phase control section, and further comprising:
   a second thermal actuator is coupled to change the temperature in the thermo-optical organic material adjacent to the first reflector; and
   a third thermal actuator is coupled to change the temperature in the thermo-optical organic material adjacent to the second reflector.

13. The tunable hybrid laser of claim 8 wherein the first material is selected from the group comprising sapphire, gallium arsenide, indium phosphide, silicon, glass, ceramic, and metal.

14. The tunable hybrid laser of claim 8 wherein the second material is selected from the group comprising sapphire, gallium arsenide, and indium phosphide.

15. A tunable laser, comprising:
   a gain medium including an active emission layer to generate optical energy, the active emission layer having a facet;

a waveguide extending from the facet, the waveguide including a core, the core having an end adjacent to the facet for receiving optical energy, the core fabricated from inorganic material and the waveguide including inorganic material and thermo-optical organic material surrounding the core;

a substrate supporting the gain medium and the waveguide;

a reflector positioned to reflect optical energy propagating along the waveguide if the optical energy has a wavelength that is one of a plurality of reflection wavelengths;

thermo-optical organic material positioned to shift the plurality of reflection wavelengths in response to changes of temperature in the thermo-optical organic material; and a first thermal actuator thermally coupled to change the temperature in the thermo-optical organic material.

16. The tunable laser of claim 15 wherein the waveguide includes a reflector-free portion interposed between the end and the reflector, the reflector-free portion including a phase control section.

17. The tunable laser of claim 16 further comprising thermo-optical organic material positioned in proximity to the phase control section.

18. The tunable laser of claim 17 wherein the thermo-optical organic material has a coefficient of refractive index variation as a function of temperature, the magnitude of which exceeds $1 \times 10^{-4}/° C$.

19. The tunable laser of claim 17 wherein the thermo-optical organic material is selected from the group comprising a polymer derived from methacrylate, a polymer derived from a siloxane, a polymer derived from carbonate, a polymer derived from styrene, a polymer derived from cyclic olefin, and a polymer derived from norbornene.

20. The tunable laser of claim 15 wherein the first thermal actuator is selected from the group comprising a resistive heater, a thermoelectric heater, and a thermoelectric cooler.

21. The tunable laser of claim 16 wherein the first thermal actuator is coupled to change the temperature in the thermo-optical organic material adjacent to the phase control section, and further comprising:

a second thermal actuator is coupled to change the temperature in the thermo-optical organic material adjacent to the first reflector; and a third thermal actuator is coupled to change the temperature in the thermo-optical organic material adjacent to the second reflector.

22. The tunable laser of claim 15 wherein the core further comprise a taper adjacent to the first end for receiving optical energy.

23. An integrated optical component, comprising:

a waveguide disposed on a substrate and including a core having an end for receiving optical energy, the core fabricated from inorganic material and the waveguide including an inorganic material and thermo-optical organic material surrounding the core;

a first reflector positioned to reflect optical energy propagating along the waveguide if the optical energy has a wavelength that is one of a plurality of first reflection wavelengths;

a second reflector positioned to reflect optical energy propagating along the waveguide if the optical energy has a wavelength that is one of plurality of second reflection wavelengths;

thermo-optical organic material positioned to shift the plurality of first and second reflection wavelengths in response to changes of temperature in the thermo-optical organic material; and a thermal actuator coupled to change the temperature in the thermo-optical organic material.

24. The integrated optical component of claim 23 wherein the waveguide includes a reflector-free portion interposed between the end and the first reflector and between the first reflector and the second reflector, the reflector-free portions including a phase control section.

25. The integrated optical component of claim 24 further comprising thermo-optical organic material positioned in proximity to the phase control sections.

* * * * *